United States Patent
Fujimoto et al.

(10) Patent No.: US 10,558,378 B2
(45) Date of Patent: Feb. 11, 2020

(54) MEMORY SYSTEM

(71) Applicant: TOSHIBA MEMORY CORPORATION, Minato-ku (JP)

(72) Inventors: Akihisa Fujimoto, Yamato (JP); Hiroyuki Sakamoto, Ome (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 30 days.

(21) Appl. No.: 15/125,875

(22) PCT Filed: Jan. 5, 2015

(86) PCT No.: PCT/JP2015/050419
§ 371 (c)(1),
(2) Date: Sep. 13, 2016

(87) PCT Pub. No.: WO2015/174099
PCT Pub. Date: Nov. 19, 2015

(65) Prior Publication Data
US 2017/0192706 A1 Jul. 6, 2017

(30) Foreign Application Priority Data
May 13, 2014 (JP) ................................. 2014-099661

(51) Int. Cl.
*G06F 3/06* (2006.01)
(52) U.S. Cl.
CPC .......... *G06F 3/0625* (2013.01); *G06F 3/0634* (2013.01); *G06F 3/0679* (2013.01)
(58) Field of Classification Search
CPC ..... G06F 3/0679; G06F 3/0634; G06F 3/0625
(Continued)

(56) References Cited

U.S. PATENT DOCUMENTS 7,114,659 B2    10/2006   Harari et al.
7,367,503 B2     5/2008   Harai et al.
(Continued)

FOREIGN PATENT DOCUMENTS

CN       10165643 A    2/2010
JP     2007-79660 A    3/2007
(Continued)

OTHER PUBLICATIONS

International Search Report dated Jul. 24, 2015 in PCT/JP2015/050419 filed Jan. 5, 2015.
(Continued)

*Primary Examiner* — Hua J Song
(74) *Attorney, Agent, or Firm* — Oblon, McClelland, Maier & Neustadt, L.L.P.

(57) ABSTRACT

According to one embodiment, there is provided a memory system including a power supply terminal, a plurality of couplers, and a control unit. The power supply terminal is a terminal to be connected to a power supply line of a host. The plurality of couplers are couplers to be electromagnetically coupled respectively to couplers of the host. The control unit can establish a reception channel and a transmission channel that are independent of each other between the memory system and the host via the plurality of couplers according to level of a power supply voltage supplied from the host via the power supply line and the power supply terminal.

19 Claims, 14 Drawing Sheets

(58) Field of Classification Search
USPC .................................................. 711/102, 103
See application file for complete search history.

(56) References Cited

U.S. PATENT DOCUMENTS

| | | | |
|---|---|---|---|
| 8,520,563 | B2 | 8/2013 | Ono et al. |
| 8,713,404 | B2 | 4/2014 | Fai et al. |
| 8,752,765 | B2 | 6/2014 | Harari et al. |
| 8,806,164 | B2 | 8/2014 | Albini et al. |
| 9,189,444 | B2 | 11/2015 | Albini et al. |
| 2003/0065903 | A1 | 4/2003 | Ashton et al. |
| 2005/0182881 | A1 | 8/2005 | Chou et al. |
| 2008/0250167 | A1 | 10/2008 | Kuroda et al. |
| 2009/0321530 | A1 | 12/2009 | Harari et al. |
| 2010/0210207 | A1* | 8/2010 | Goto .................... G06K 7/0008 455/41.1 |
| 2011/0107128 | A1 | 5/2011 | Otani et al. |
| 2013/0019113 | A1* | 1/2013 | Yamaya ................. G06F 1/266 713/300 |
| 2013/0238910 | A1 | 9/2013 | Liu et al. |
| 2014/0055945 | A1 | 2/2014 | Sudak |
| 2014/0087668 | A1 | 3/2014 | Mow et al. |
| 2014/0223213 | A1* | 8/2014 | Yamazaki ............. G06F 1/3268 713/324 |
| 2016/0055103 | A1 | 2/2016 | Albini et al. |

FOREIGN PATENT DOCUMENTS

| | | |
|---|---|---|
| JP | 2013-69019 A | 4/2013 |
| KR | 10-2011-0115419 A | 10/2011 |
| KR | 10-2012-0052880 A | 5/2012 |
| TW | I317479 | 11/2009 |
| TW | 201239635 A1 | 10/2012 |

OTHER PUBLICATIONS

Written Opinion dated Jul. 24, 2015 in PCT/JP2015/050419 filed Jan. 5, 2015.
Taiwanese Office Action dated Jan. 12, 2016 in Taiwanese Application No. 103146355 (with English translation).
"WiGig White Paper: Defining the Future of Multi-Gigabit Wireless Communications", Wireless Gigabit Alliance, Jul. 2010, pp. 1-5, XP008173868.
"Universal Serial Bus Specification Revision 2.0", Compaq Computer Corporation et al., Apr. 27, 2000, 650 pages, XP008147911.
"Carrier Wave", Wikipedia Retrieved from the internet: URL http://en.wikipedia.org/w/index.php?title=Carrier_WAVE&OLDID=607747998 , XP055434857, May 9, 2014, 2 pages.

* cited by examiner

FIG.6

| HBI | HEADER | HOST ID | all 0 | FD CAPABILITY | OVERLAP-TYPE CAPABILITY | CRC |
|---|---|---|---|---|---|---|

| MBI | HEADER | HOST ID | MEMORY-SYSTEM ID | MEMORY-SYSTEM CAPABILITY & PRIORITY | CRC |
|---|---|---|---|---|---|

| ERR | HEADER | (HOST ID) | MEMORY-SYSTEM ID | DESCRIPTION OF ERROR | CRC |
|---|---|---|---|---|---|

FIG.14
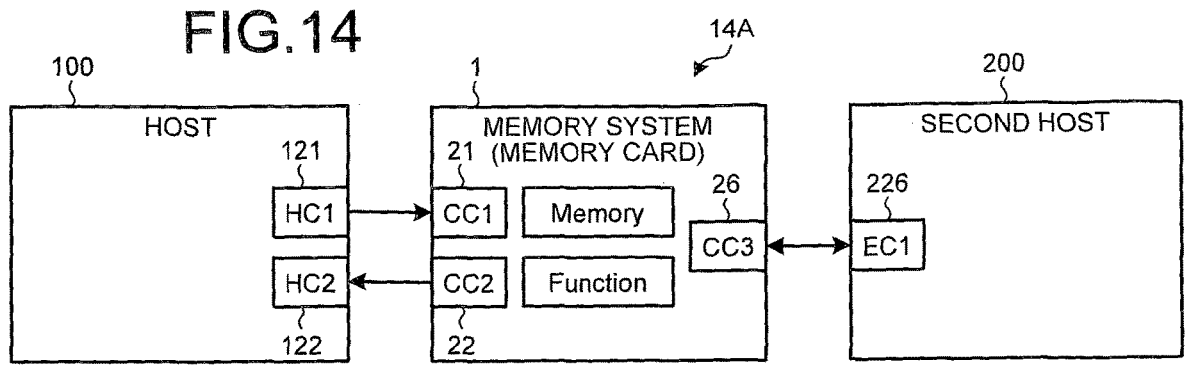
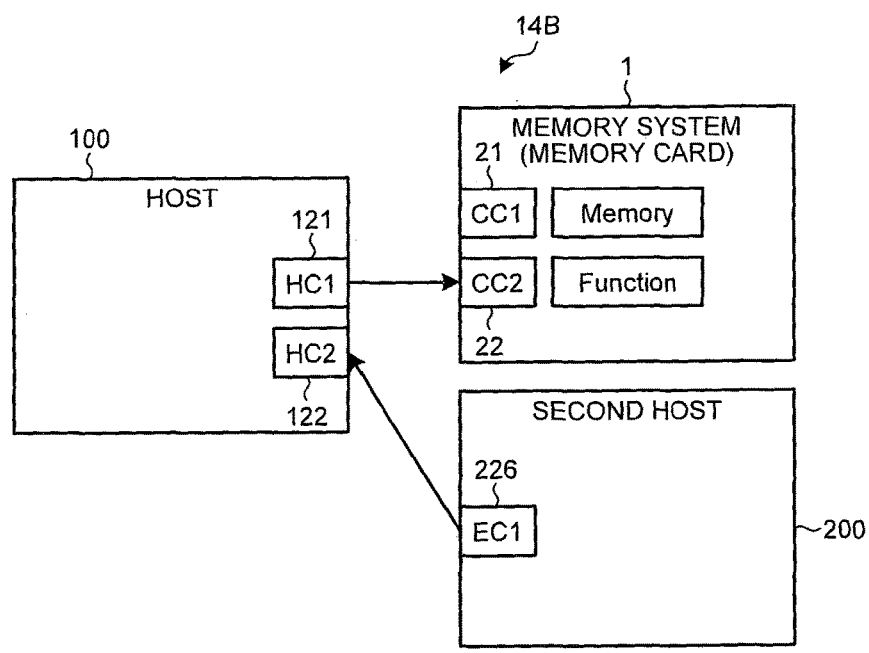
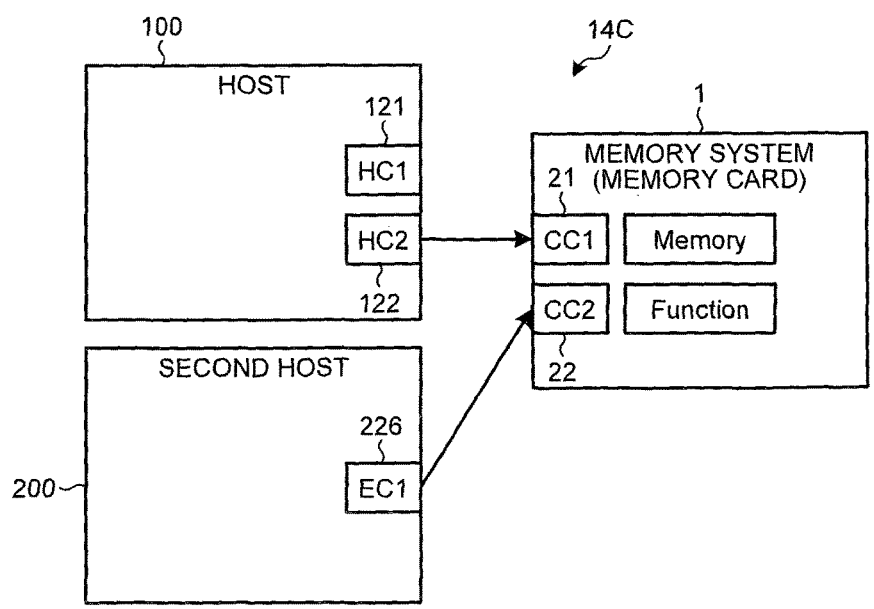

MEMORY SYSTEM

CROSS-REFERENCE TO RELATED APPLICATIONS

This application is based upon and claims the benefit of priority from Japanese Patent Application No. 2014-099661, filed on May 13, 2014; the entire contents of which are incorporated herein by reference.

FIELD

Embodiments described herein relate generally to a memory system.

BACKGROUND

A memory system using nonvolatile semiconductor memories such as a memory card may transmit and receive a large volume of data such as image data or voice data to and from a host. In these applications, it is required to read or write a lot of information in a shorter time, that is, to make the data transfer speed higher. Conventionally the host and the card have been connected by board wiring or a cable, but because the physical characteristics of the wiring or cable have a greater influence as the speed becomes higher, it is becoming difficult to implement.

CITATION LIST

Patent Literature

[PTL 1] Japanese Patent Application Laid-open No. 2013-69019
[PTL 2] Japanese Patent Application Laid-open No. 2007-79660

BRIEF DESCRIPTION OF THE DRAWINGS

FIG. 6 is a diagram showing the data structures of packets in the first embodiment;
FIG. 14 is a diagram showing the topology of the memory system (memory card), the host, and a second host in the fourth embodiment.

DETAILED DESCRIPTION

In general, according to one embodiment, there is provided a memory system including a power supply terminal, a plurality of couplers, and a control unit. The power supply terminal is a terminal to be connected to a power supply line of a host. The plurality of couplers are couplers to be electromagnetically coupled respectively to couplers of the host. The control unit can establish a reception channel and a transmission channel that are independent of each other between the memory system and the host via the plurality of couplers according to level of a power supply voltage supplied from the host via the power supply line and the power supply terminal.

Exemplary embodiments of a memory system will be explained below in detail with reference to the accompanying drawings. The present invention is not limited to the following embodiments.

First Embodiment

Figure 1:
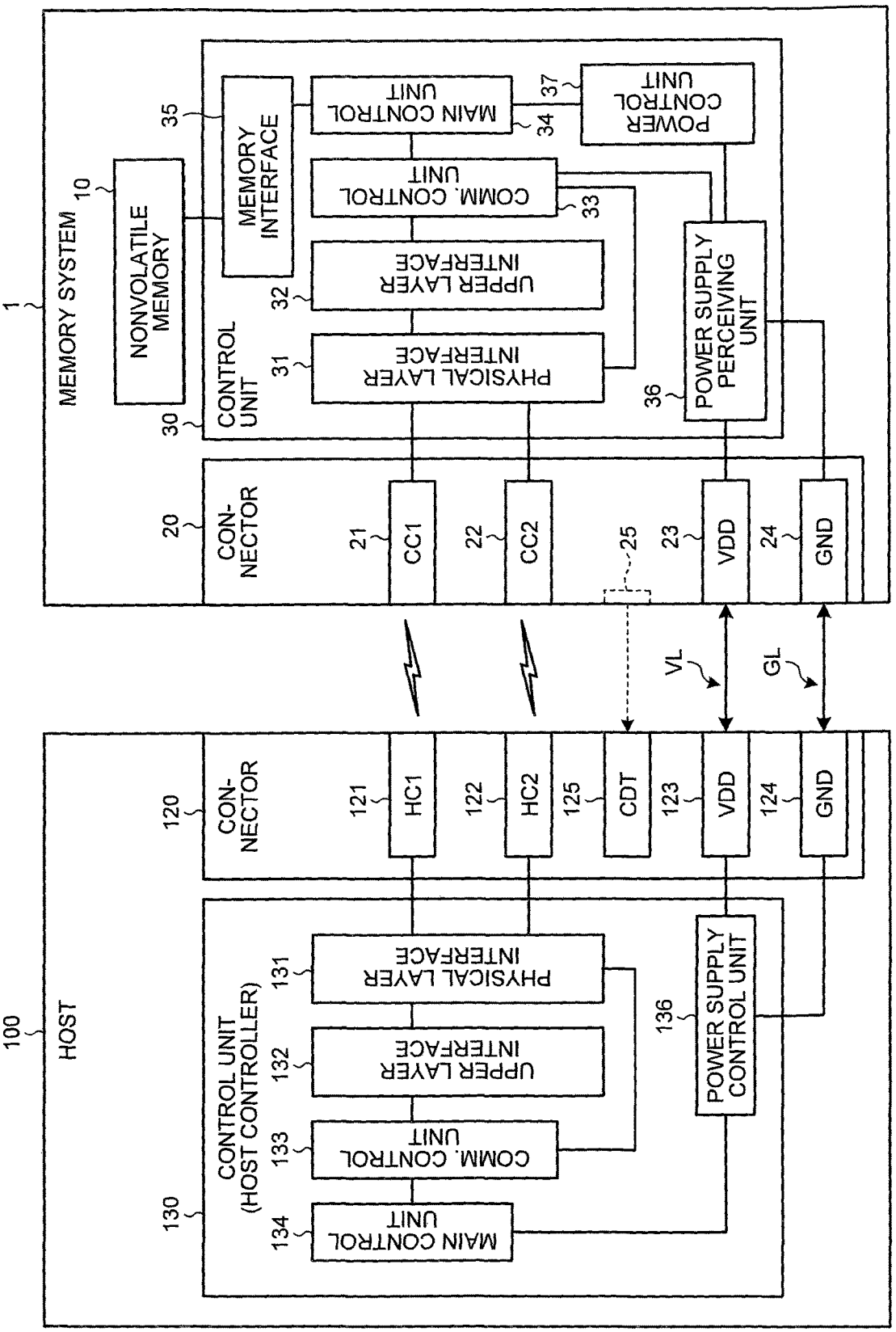
FIG. 1 is a diagram showing the configuration of a memory system according to a first embodiment.

A memory system 1 according to the first embodiment will be described using FIG. 1. FIG. 1 is a diagram showing the configuration of the memory system 1.

The memory system 1 has a nonvolatile memory 10 and functions as an external storage medium for a host 100. The memory system 1 may be, for example, a memory card configured to be attachable to and detachable from the host 100 or an embedded device to be mounted in the housing of the host 100.

The memory system 1 communicates with the host 100 to store data into the nonvolatile memory 10 according to a command received from the host 100. Further, the memory system 1 reads data from the nonvolatile memory 10 to transmit to the host 100 or transmits a predetermined response to the host 100 according to a command received from the host 100. With the simplest configuration, communication is conducted between the memory system 1 and the host 100 via a P2P (peer to peer) connection.

The memory system 1 may transmit and receive a large volume of data such as image data or voice data to and from the host 100. In these applications, it is required to read or write a lot of information in a shorter time, that is, to make the data transfer speed higher. That is, higher speed is required of the communication interface with the host 100 in the memory system 1. For example, in the case where the memory system 1 is a memory card, higher speed is being sought in compliance with a standard such as HS (High Speed), UHS-I (UHS: Ultra High Speed), or UHS-II. Communication interfaces compliant with these standards are interfaces by a wired connection.

Where a wired connection is used as the method of communication connection between the memory system 1 and the host 100, there may occur disturbances in transmitted waveforms due to the influence of the physical characteristics of the communication path, so that the limit of communication speed may occur. For example, the limit of communication speed may occur due to the electrical characteristics of wiring material and an impedance mismatch depending on the connector and the pattern of the printed board. Or, for example, for the high frequency range, it is necessary to consider the way to suppress reflected waves, and also in this regard, the limit of communication speed may occur.

In contrast to this, the case of implementing radio communication using radio waves as the method of communication connection between the memory system 1 and the host 100 is considered. In the case of using radio waves with generating a carrier wave all the time, a great transmission power loss exists.

Accordingly, in the present embodiment, as shown in FIG. 1, near-field radio communication using electromagnetic coupling, which does not need a carrier wave, rather than radio waves is conducted for the P2P connection between the memory system 1 and the host 100. FIG. 1 is a diagram showing the configurations of the memory system 1 and the host 100. Higher speed than that of the wired connection can be expected from the near-field radio technique because of being less likely to be affected by the physical characteristics of the communication path. Further, with the near-field radio technique, because the communication distance is short and energy stored in a space due to electromagnetic induction by an alternating current is returned, power consumption can be easily lowered if the secondary side (reception side) does not consume energy. Yet further, by making electromagnetic waves have directivity via the structure of a coupler (antenna), power can be saved.

Specifically, the memory system 1 has a nonvolatile memory 10, a connector 20, and a control unit 30. The connector 20 has a plurality of couplers 21, 22, a power supply terminal 23, and a ground terminal 24. The host 100 has a connector 120 and a control unit 130. The connector 120 has a plurality of couplers 121, 122, a power supply terminal 123, and a ground terminal 124.

The plurality of couplers 21, 22 are couplers to be electromagnetically coupled respectively to the couplers of the host 100. Where the memory system 1 is a memory card, when the memory system 1 is mounted (e.g., inserted) in the host 100, the couplers 21, 22 are electromagnetically coupled respectively to the couplers of the host 100. Where the memory system 1 is an embedded device, the couplers 21, 22 are electromagnetically coupled respectively to the couplers of the host 100 by attaching (mounting) the memory system 1 onto the mother board (not shown) of the host 100.

For example, in the case of FIG. 1, when the memory system 1 is mounted in the host 100, the coupler (CC1) 21 is located to face the coupler (HC1) 121, and the coupler (CC2) 22 is located face the coupler (HC2) 122. Thus, the coupler (CC1) 21 is electromagnetically coupled to the coupler (HC1) 121, and the coupler (CC2) 22 is electromagnetically coupled to the coupler (HC2) 122. The couplers 21, 22, 121, 122 are each configured to amplify the near-electric-field component with suppressing the far-electric-field component so as to communicate with a coupler within a predetermined short distance.

Here, consider the case where there is only one communication channel between the memory system 1 and the host 100. In this case, when the memory system 1 is mounted in the host 100, the communication direction is controlled. That is, because half-duplex communication is performed in which the transmission direction is switched alternately between the memory system 1 and the host 100, overhead of processing occurs in the control of switching the communication direction, and thus a decrease in the communication speed may occur.

In contrast to this, in the present embodiment, the couplers 21, 22, 121, 122 are configured such that communication interference between the plurality of sets (pairs) of electromagnetically-coupled couplers is suppressed. Thus, a plurality of communication channels can be established with the sets of electromagnetically-coupled couplers, and hence interference between the plurality of communication channels can be reduced, thus easily making the communication path be full-duplex.

For example, the coupler (CC1) 21 and the coupler (CC2) 22 are placed a predetermined short distance or greater away from each other in the connector 20. The coupler (HC1) 121 and the coupler (HC2) 122 are placed a predetermined short distance or greater away from each other in the connector 120. Thus, interference between electromagnetic waves communicated between the coupler (CC1) 21 and the coupler (HC1) 121 by electromagnetic coupling and those communicated between the coupler (CC2) 22 and the coupler (HC2) 122 by electromagnetic coupling can be easily reduced.

For example, the couplers 21, 22 each have directivity, and the couplers 121, 122 each have directivity. The couplers 21, 22 each have high directivity of the direction in which to face the coupler of the host 100 when the memory system 1 is mounted in the host 100. The couplers 121, 122 each have high directivity of the direction in which to face the coupler of the memory system 1 when the memory system 1 is mounted in the host 100. Thus, interference between electromagnetic waves communicated between the coupler (CC1) 21 and the coupler (HC1) 121 by electromagnetic coupling and those communicated between the coupler (CC2) 22 and the coupler (HC2) 122 by electromagnetic coupling can be easily reduced.

For example, the frequencies of electromagnetic waves (an RF signal) communicated between the coupler (CC1) 21 and the coupler (HC1) 121 are made different from those of electromagnetic waves (an RF signal) communicated between the coupler (CC2) 22 and the coupler (HC2) 122. Thus, interference between electromagnetic waves communicated between the coupler (CC1) 21 and the coupler (HC1) 121 by electromagnetic coupling and those communicated between the coupler (CC2) 22 and the coupler (HC2) 122 by electromagnetic coupling can be easily reduced.

Note that any one of placing couplers of different sets a predetermined short distance or greater away from each other, making the couplers each have directivity, and making the frequencies of electromagnetic waves communicated different for each set of couplers may be applied to the couplers 21, 22, 121, 122 or that two or more of them may be applied in combination to the couplers.

The power supply terminal 23 is one to connect to the power supply line VL of the host 100. For example, in the case of FIG. 1, when the memory system 1 is mounted in the host 100, the power supply terminal (VDD) 23 is connected to the power supply terminal (VDD) 123 via the power supply line VL.

The ground terminal 24 is one to connect to the ground line GL of the host 100. For example, in the case of FIG. 1, when the memory system 1 is mounted in the host 100, the ground terminal (GND) 24 is connected to the ground terminal (GND) 124 via the ground line GL.

Note that, where the memory system 1 is a memory card, the connector 120 of the host 100 may further have a card detecting unit (CDT) 125. When the memory system 1 is mounted in the host 100, the card detecting unit (CDT) 125 detects a to-be-touched portion 25 in the connector 20 physically touching the card detecting unit 125. When detecting the to-be-touched portion 25 in the connector 20 physically touching the card detecting unit 125, the card detecting unit (CDT) 125 changes the level of a detection signal CDT, e.g., from a low (L) level to a high (H) level to output the signal.

The control unit 30 communicates with the host 100 via the connector 20 and performs various controls, according to commands from the host 100, or autonomously. The control unit 130 communicates with the memory system 1 via the connector 120 and transmits commands to the memory system 1 to control the memory system 1. The control unit 130 controls the level of the power supply voltage supplied to the memory system 1. The control unit 30 can establish a reception channel and a transmission channel that are independent of each other between the memory system 1 and the host 100 via the couplers 21, 22 according to the level of the power supply voltage supplied from the host 100 via the power supply line VL and the power supply terminal (VDD) 23.

For example, where the memory system 1 is a memory card, the control unit 130 switches the level of the power supply voltage to be supplied to the memory system 1 via the power supply terminal (VDD) 123 and the power supply line VL from a first level to a second level in response to detecting the memory system 1 being mounted in the host 100 by the card detecting unit 125. The first level is, for example, the L level (GND level). The second level is higher than the first level and is, for example, the H level (e.g., 3.3 V). That is, card detection is performed by the connector 120, and power is supplied from the host 100 to the memory system 1 via the power supply terminals 123, 23 of the connectors 120, 20 to start radio communication, and hence power consumption can be lowered.

Where the memory system 1 is an embedded device, the control unit 130 switches the level of the power supply voltage to be supplied to the memory system 1 via the power supply terminal (VDD) 123 and the power supply line VL from the first level to the second level in response to the occurrence of a need to access the memory system 1.

The control unit 30 can operate to establish a communication channel of the physical layer in response to the level of the power supply voltage supplied from the host 100 via the power supply line VL and the power supply terminal (VDD) 23 being switched from the first level to the second level.

The control unit 30 has a physical layer interface 31, an upper layer interface 32, a communication control unit 33, a main control unit 34, a memory interface 35, a power supply perceiving unit 36, and a power control unit 37. The control unit 130 has a physical layer interface 131, an upper layer interface 132, a communication control unit 133, a main control unit 134, and a power supply control unit 136.

The physical layer interfaces 31, 131 perform communication-interface operation for the physical layer. The physical layer interfaces 31, 131 convert an RF signal (physical layer packet) received by the coupler into digital information (a physical layer packet) to supply to the upper layer interfaces 32, 132 or the communication control units 33, 133. Further, the physical layer interfaces 31, 131 convert digital information (a physical layer packet) supplied from the upper layer interfaces 32, 132 or the communication control units 33, 133 into an RF signal (physical layer packet) to transmit by the coupler.

The upper layer interfaces 32, 132 perform communication-interface operation for the upper layer. The upper layer interfaces 32, 132 protocol-convert digital information (a physical layer packet) supplied from the physical layer interfaces 31, 131 into data to be internally processed (an upper layer packet) to supply to the communication control units 33, 133. Further, the upper layer interfaces 32, 132 protocol-convert data internally processed (an upper layer packet) into to-be-transmitted digital information (a physical layer packet) to supply to the communication control units 33, 133.

The communication control unit 33 controls communication operation of the physical layer interface 31 and the upper layer interface 32. The communication control unit 133 controls communication operation of the physical layer interface 131 and the upper layer interface 132. The main control unit 34 controls the parts of the control unit 30 globally. The power supply control unit 136 controls the level of the power supply voltage to be supplied to the memory system 1 via the power supply terminal 123 and the ground terminal 124 under the control of the main control unit 134. The power supply perceiving unit 36 perceives the level of the power supply voltage supplied from the host 100 via the power supply terminal 23 and the ground terminal 24.

For example, the main control units 34, 134 are constituted by processors or the like; the physical layer interfaces 31, 131 are constituted by circuits that deal with a frequency band that a processor cannot control; and the upper layer interfaces 32, 132 are constituted by circuits that can be controlled by the firmware of a processor, and programs.

The communication control unit 133 controls the physical layer interface 131 in response to detecting the memory system 1 being mounted in the host 100 or in response to the occurrence of a need to access the memory system 1. For example, the communication control unit 133 has the physical layer interface 131 perform operation to establish a communication channel of the physical layer in response to the level of the power supply voltage being switched from the first level (e.g., the L level) to the second level (e.g., the H level). When a communication channel of the physical layer is established, the communication control unit 133 controls the upper layer interface 132 to perform operation to establish a communication channel of an upper layer.

The communication control unit 33 controls the physical layer interface 31 according to the level of the power supply voltage perceived by the power supply perceiving unit 36. For example, the communication control unit 33 has the physical layer interface 31 perform operation to establish a communication channel of the physical layer in response to the level of the power supply voltage being switched from the first level (e.g., the L level) to the second level (e.g., the H level). When a communication channel of the physical layer is established, the communication control unit 33 controls the upper layer interface 32 to perform operation to establish a communication channel of the upper layer.

The power control unit 37 performs operation for power control in the memory system 1 according to the level of the power supply voltage perceived by the power supply perceiving unit 36.

The memory interface 35 accesses the nonvolatile memory 10 in response to a request from the main control unit 34. For example, the memory interface 35 writes data into the nonvolatile memory 10 in response to a write request and reads data from the nonvolatile memory 10 in response to a read request.

Figure 2:
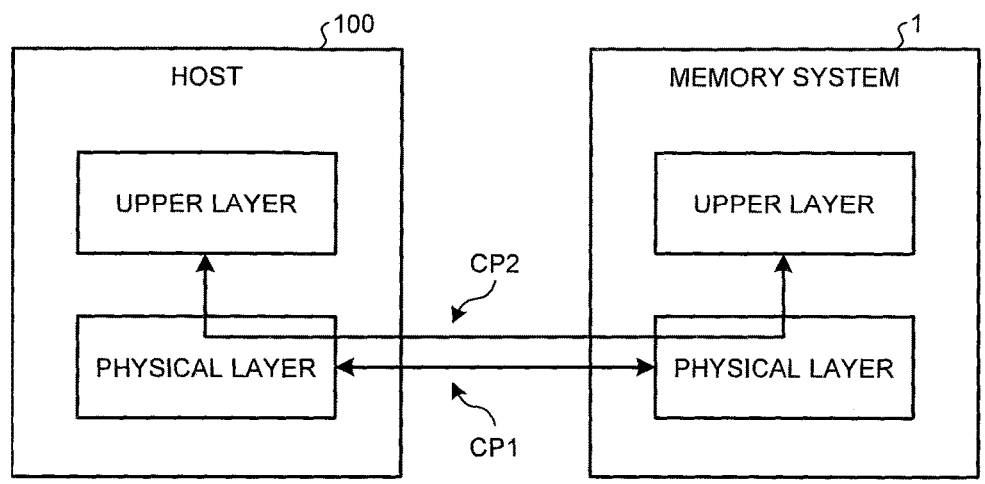
FIG. 2 is a diagram showing a communication layer structure in the first embodiment.

Next, establishing communication channels will be described using FIG. 2. FIG. 2 is a diagram showing a communication layer structure. While the communication channel is formed of a plurality of layers, FIG. 2 shows a conceptual diagram where the communication channel is divided broadly into two layers. In FIG. 2, it is divided into the physical layer and the other, the upper layer. The upper layer includes, for example, a connection layer and a protocol conversion layer.

Establishing a communication path between the host 100 and the memory system 1 is executed in the following four steps. The physical layers (physical layer interfaces) exchange physical-layer packets to confirm what communication path can be made (S1). The physical layers (physical layer interfaces) establish a communication path CP1 of the physical layer using an appropriate choice (capability) for between the two, the transmission side and the reception side (S2). The upper layers (upper layer interfaces) exchange upper-layer packets via the communication path CP1 to determine a packet specification, a protocol specification, and the like (S3). The upper layers (upper layer interfaces) establish a communication path CP2 of the upper layer (S4). Thereafter, the upper layers (upper layer interfaces) on the transmission side and the reception side can exchange packets to communicate with each other.

Figure 3:
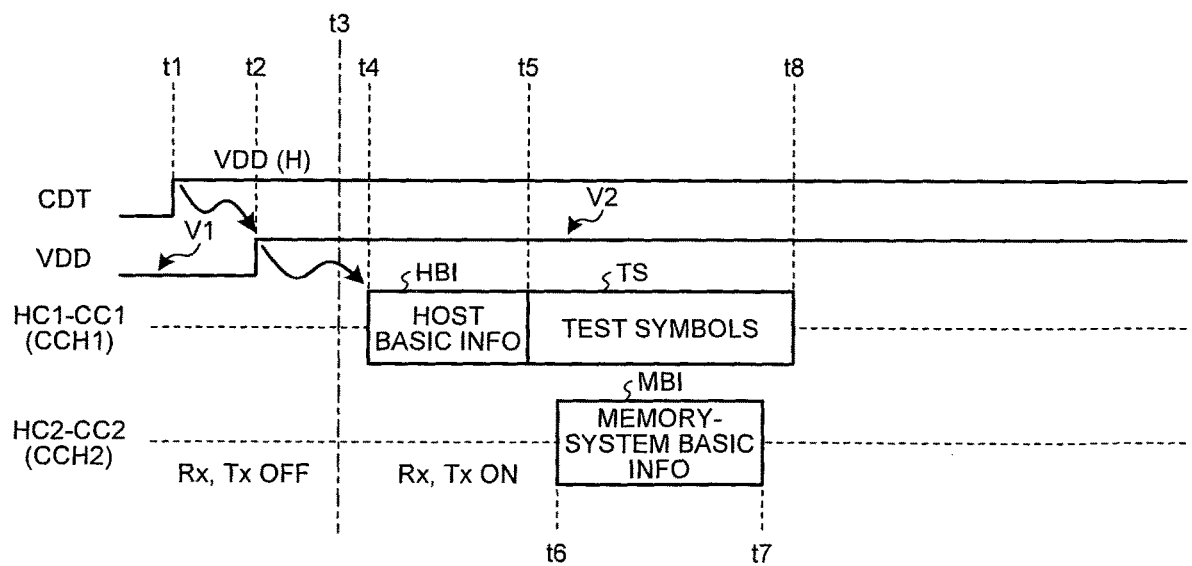
FIG. 3 is a diagram showing the startup of a physical layer (full-duplex mode) in the first embodiment.
Figure 4:
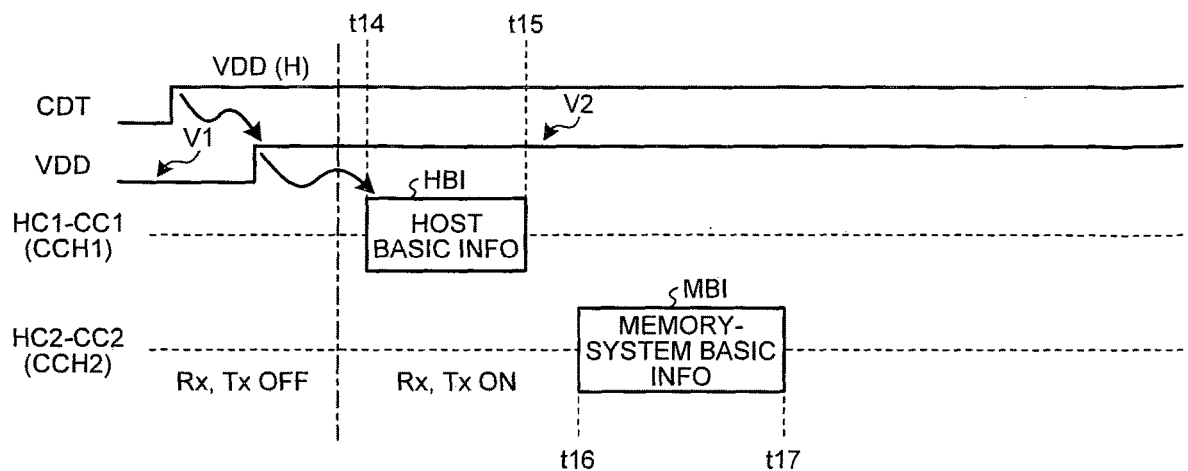
FIG. 4 is a diagram showing the startup of a physical layer (non-overlap-type full-duplex mode) in the first embodiment.
Figure 5:
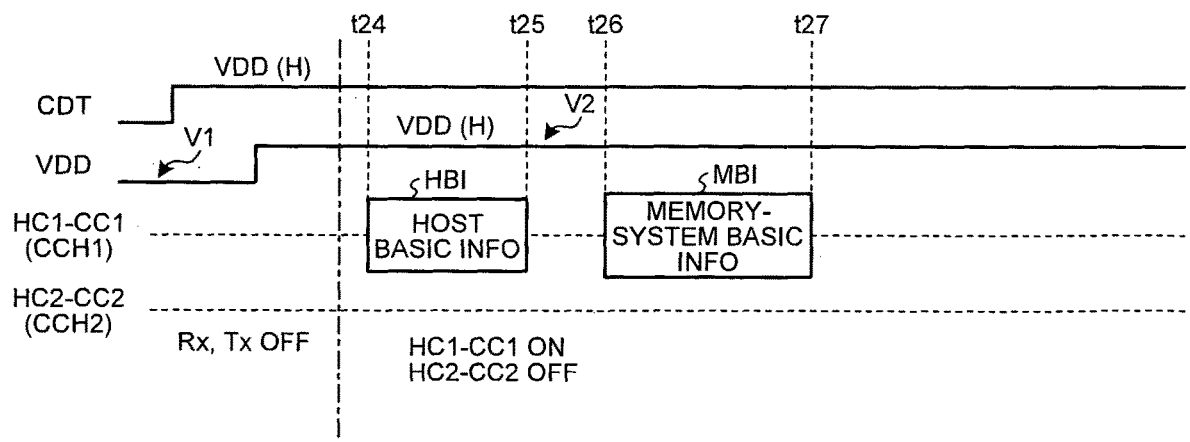
FIG. 5 is a diagram showing the startup of a physical layer (half-duplex mode) in the first embodiment.
Figure 7:
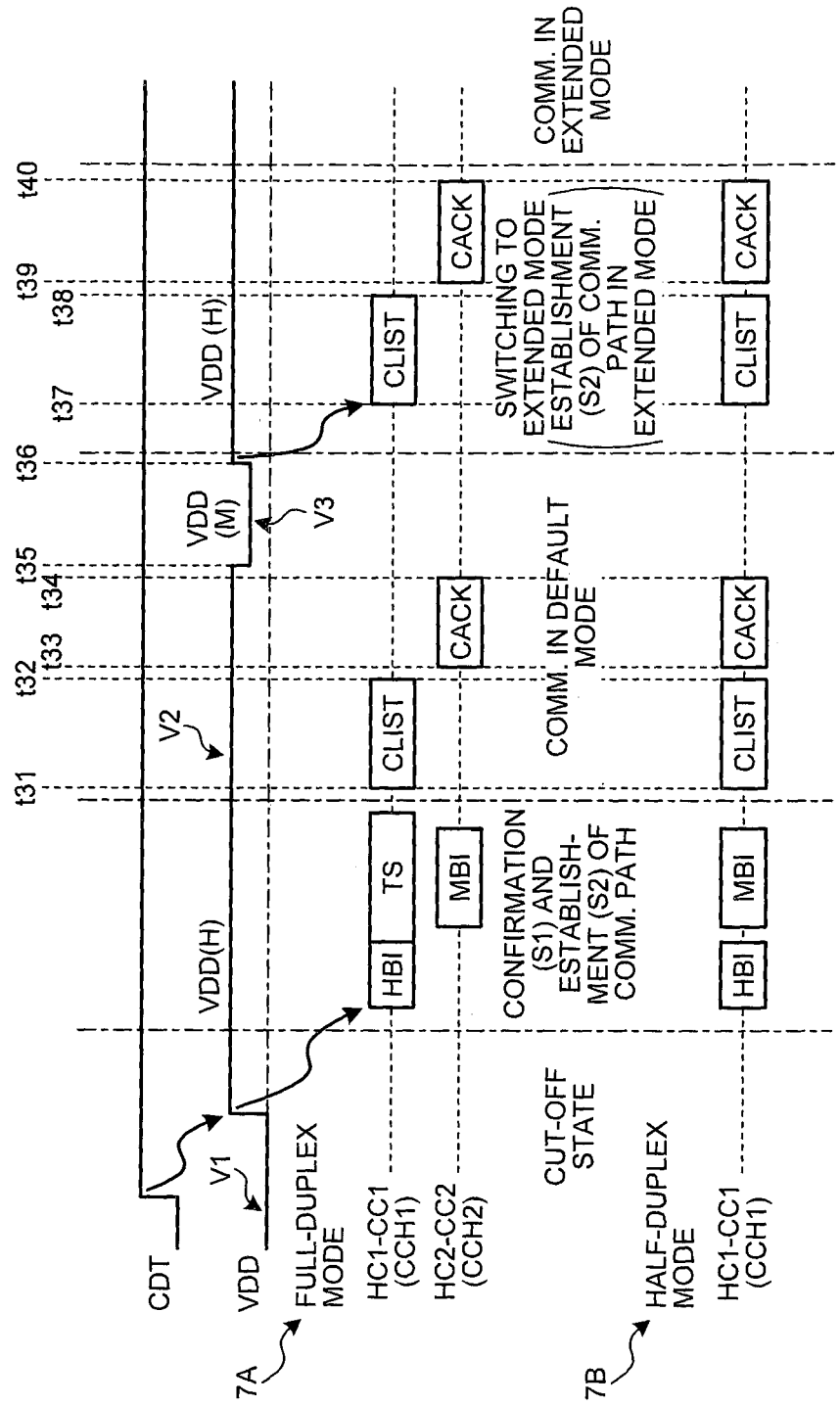
FIG. 7 is a diagram showing a sequence of going into an extended mode in the first embodiment.

Next, details of establishing the communication path CP1 of the physical layer (S1, S2) will be described using FIGS. 3 to 7. FIG. 3 is a diagram showing the procedure of confirming at the startup of the physical layer whether the communication path can operate in a full-duplex mode. FIG. 4 is a diagram showing the procedure of confirming at the startup of the physical layer whether the communication path can operate in a non-overlap-type full-duplex mode. FIG. 5 is a diagram showing the procedure of confirming at the startup of the physical layer whether the communication path can operate in a half-duplex mode. FIG. 6 is a diagram showing example data structures of packets. FIG. 7 is a diagram showing a sequence of going into an extended mode. When there is no normal packet, the communication channel is filled with synchronous symbols and idle symbols, but they are omitted from FIGS. 3 to 5 and 7 so as not to be shown.

The first packet exchange between the host 100 and the memory system 1 is a sequence of confirming whether the respective communication interfaces of the host 100 and the memory system 1 can operate correctly in the current mode. The host 100 has the connection between the host 100 and the memory system 1 retry stepwise in the order of the full-duplex mode (FIG. 3) to the non-overlap-type full-duplex mode (FIG. 4) to the half-duplex mode (FIG. 5) depending on the result of this confirmation (S1). Each retry may be one time execution or multiple times of execution.

A retry of the full-duplex mode is performed as shown in FIG. 3. In FIG. 3, the communication channel of the coupler (HC1) 121 and the coupler (CC1) 21 that are electromagnetically coupled to each other is denoted by CCH1, and the communication channel of the coupler (HC2) 122 and the coupler (CC2) 22 that are electromagnetically coupled to each other is denoted by CCH2.

Where the memory system 1 is a memory card, during the period before timing t1, in the control unit 30, the communication circuit (receiving circuit Rx, transmitting circuit Tx) does not consume power because of being in a power-off state according to the memory system 1 not being mounted in the host 100. The communication circuit (receiving circuit Rx, transmitting circuit Tx) includes the couplers 21, 22 and the physical layer interface 31.

Where the memory system 1 is a memory card, at timing t1, the control unit 130 detects the memory system 1 being mounted in the host 100 in response to the detection signal CDT of the card detecting unit 125 changing from the L level to the H level. Note that the timing t1 may start upon another event that the host system can use instead of card detection.

Where the memory system 1 is a memory card, at timing t2, the control unit 130 changes the level of the power supply voltage (VDD) to be supplied to the memory system 1 from the first level V1 (e.g., the L level) to the second level V2 (e.g., the H level) in response to detecting the memory system 1 being mounted in the host 100. The second level is higher than the first level V1. For example, the power supply control unit 136 has a voltage regulator (see FIG. 10) operate to supply power to the communication circuit (couplers 121, 122). Further, the power supply control unit 136 supplies the power supply voltage of the second level V2 to the power supply terminal (VDD) 23 via the power supply terminal (VDD) 123 and the power supply line VL.

It should be noted that, in a case where the memory system 1 is an embedded device, the detection signal CDT in FIG. 3 may be omitted. In this case, at timing t2, the control unit 130, in response to the occurrence of a need for the host 100 to access the memory system 1, changes the level of the power supply voltage (VDD) to be supplied to the memory system 1 from the first level V1 (e.g., the L level) to the second level V2 (e.g., the H level).

At timing t3, the control unit 30, in response to the level of the power supply voltage supplied from the host 100 changing from the first level V1 to the second level V2, turns on the communication circuit (receiving circuit Rx, transmitting circuit Tx) so as to be in the state of waiting for communication from the host 100.

During the period from timings t4 to t5, the control unit 130 of the host 100 transmits host basic information HBI via the communication channel CCH1 to the control unit 30 of the memory system 1. The control unit 30 of the memory system 1 receives the host basic information HBI via the communication channel CCH1 from the control unit 130 of the host 100.

The host basic information HBI is information about the capabilities of the host 100. The host basic information HBI includes, for example, a header, a host ID, all zeros, an FD (full-duplex) capability, an overlap-type capability (either overlap-type or non-overlap-type), and a CRC (cyclic redundancy check) code as shown in FIG. 6. The header includes a start bit indicating the start of the host basic information HBI, information indicating that this packet is host basic information HBI, and the like. The host ID is information to identify the host 100. The all zeros indicates that all the bits are zero because the ID of the memory system 1 is unknown. The FD (full-duplex) capability is information indicating whether full-duplex communication is possible and is, for example, at 1 if full-duplex communication is possible and at 0 if full-duplex communication is not possible (half-duplex communication is possible). The overlap-type capability is at 1 if the full-duplex communication is of the overlap type and at 0 if the full-duplex communication is of the non-overlap type. The CRC (cyclic redundancy check) code is a code for performing error detection.

At timing t5 shown in FIG. 3, the control unit 130 finishes transmitting the host basic information HBI. The control unit 30 finishes receiving the host basic information HBI.

During the period from timings t5 to t6 shown in FIG. 3, the control unit 30 of the memory system 1 performs a CRC check (error detection) using the CRC code included in the host basic information HBI. When the CRC is correct (succeeding in the CRC check), the memory system 1 confirms the contents of the host basic information HBI. If detecting the FD (full-duplex) capability included in the host basic information HBI being at 1 (full-duplex communication is possible) and the overlap-type capability being at 1 (overlap-type), then the memory system 1 performs operation confirmation in the overlap-type full-duplex mode (see FIG. 3). In contrast, if detecting the FD (full-duplex) capability being at 1 (full-duplex communication is possible) and the overlap-type capability being at 0 (non-overlap-type), then the memory system 1 performs operation confirmation in the non-overlap-type full-duplex mode (see FIG. 4) without going through operation confirmation in the overlap-type full-duplex mode.

If detecting the FD (full-duplex) capability included in the host basic information HBI being at 0 (full-duplex communication is not possible), the control unit 30 performs a retry of the half-duplex mode (see FIG. 5) that is a retry of the third step without going through a retry of the non-overlap-type full-duplex mode (see FIG. 4) that is a retry of the second step.

During the period from timings t6 to t7 shown in FIG. 3, the control unit 30 of the memory system 1 transmits memory-system basic information MBI to the control unit 130 of the host 100 via the communication channel CCH2 in response to the success in the CRC check (host basic information HBI was correctly received). The control unit 130 of the host 100 receives the memory-system basic information MBI from the control unit 30 of the memory system 1 via the communication channel CCH2.

Note that the control unit 30 of the memory system 1 does not respond if failing in the CRC check (detecting an error).

The memory-system basic information MBI is information about the capabilities of the memory system 1. The memory-system basic information MBI includes, for example, a header, a host ID, a memory-system ID, a memory-system capability and priority, and a CRC (cyclic redundancy check) code as shown in FIG. 6. The header includes a start mark indicating the start of the memory-system basic information MBI, information indicating that the type of this packet is memory-system basic information MBI, and the like. The host ID is information to identify the host 100. The memory-system ID is information to identify the memory system 1. The memory-system capability and priority includes information indicating capabilities (e.g., communication speed, communication frequencies, and a communication protocol) concerning the communication of the memory system 1, information indicating the priorities of them (which one of the capabilities should be prioritized), and the like. The CRC (cyclic redundancy check) code is a code for performing error detection.

During the period from timings t5 to t8 shown in FIG. 3, at the same time that it receives the memory-system basic information MBI via the communication channel CCH2, the control unit 130 of the host 100 transmits test symbols TS to the control unit 30 of the memory system 1 via the communication channel CCH1. The control unit 30 of the memory system 1 transmits the memory-system basic information MBI to the control unit 130 of the host 100 via the communication channel CCH2 at the same time that it receives the test symbols TS from the control unit 130 of the host 100 via the communication channel CCH1.

By this means, the control unit 130 of the host 100 checks for mutual interference between the communication channels CCH1, CCH2. The control unit 130 continues sending the test symbols TS until it finishes receiving the memory-system basic information MBI. As the test symbols TS, a pattern having sudden and sharp changes is used which is likely to produce influence by electromagnetic waves and induction. When detecting finishing the reception of the memory-system basic information MBI (at timing t7), the control unit 130 stops outputting the test symbols TS (t8).

Immediately after timing t7, the control unit 130 of the host 100 determines whether the memory-system basic information MBI has been correctly received. For example, the control unit 130 of the host 100 performs a CRC check using the CRC code included in the received memory-system basic information MBI. When succeeding in the CRC check, the control unit 130 of the host 100 can determine that the memory-system basic information MBI has been correctly received. When failing in the CRC check (detecting an error), the control unit 130 of the host 100 can determine that the memory-system basic information MBI has not been correctly received.

It should be noted that, although not shown in the figure, likewise, when receiving a packet from the host 100, the memory system 1 can send test symbols TS so that interference of the opposite direction can be checked for. In the example of FIG. 3, the interference check of one direction is performed.

If the memory-system basic information MBI has been correctly received, the control unit 130 of the host 100 adopts the overlap-type full-duplex communication for communication from this point forward, using the communication channel CCH1 as the transmission channel and the communication channel CCH2 as the reception channel. If not having received a request for another retry from the host 100 within a predetermined period after finishing transmitting the memory-system basic information MBI, the control unit 30 of the memory system 1 adopts the overlap-type full-duplex communication for communication from this point forward, using the communication channel CCH1 as the reception channel and the communication channel CCH2 as the transmission channel (S2).

Then the control unit 130 of the host 100 proceeds to the sequence subsequent to timing t31 shown in FIG. 7A as needed.

If the memory-system basic information MBI has not been correctly received, the control unit 130 of the host 100 determines that there was mutual interference and performs a retry of the non-overlap-type full-duplex mode that is a retry of the second step.

The retry of the non-overlap-type full-duplex mode is performed as shown in FIG. 4. The capabilities of the host basic information HBI are set at the full-duplex mode and the non-overlap type. In the non-overlap-type full-duplex mode, the control unit 130 of the host 100 does not transmit test symbols TS.

That is, during the period from timings t14 to t15, the host basic information HBI is transmitted from the control unit 130 of the host 100 to the control unit 30 of the memory system 1 via the communication channel CCH1. During the period from timings t16 to t17, the memory-system basic information MBI is transmitted from the control unit 30 of the memory system 1 to the control unit 130 of the host 100 via the communication channel CCH2. At this time, test symbols TS are not transmitted.

Immediately after timing t17, the control unit 130 of the host 100 determines whether the memory-system basic information MBI has been correctly received. For example, the control unit 130 of the host 100 performs a CRC check using the CRC code included in the received memory-system basic information MBI. When succeeding in the CRC check, the control unit 130 of the host 100 can determine that the memory-system basic information MBI has been correctly received. When failing in the CRC check, the control unit 130 of the host 100 can determine that the memory-system basic information MBI has not been correctly received.

If the memory-system basic information MBI has been correctly received, the control unit 130 of the host 100 adopts the non-overlap-type full-duplex communication for communication from this point forward, using the communication channel CCH1 as the transmission channel and the communication channel CCH2 as the reception channel. If not having received a request for another retry from the host 100 within a predetermined period after finishing transmitting the memory-system basic information MBI, the control unit 30 of the memory system 1 adopts the non-overlap-type full-duplex communication for communication from this point forward, using the communication channel CCH1 as the reception channel and the communication channel CCH2 as the transmission channel (S2).

Although from this point forward the plurality of communication channels CCH1, CCH2 are used in full-duplex mode, control is performed so that a transmit packet and a receive packet do not overlap temporally. That is, it is the non-overlap-type full-duplex communication using the plurality of communication channels CCH1, CCH2. As compared with the full-duplex communication (see FIG. 3) that can transmit and receive simultaneously in parallel, the communication efficiency may be reduced, but is better than that of half-duplex communication because there is no overhead associated with switching directions.

Then the control unit 130 of the host 100 proceeds to the sequence subsequent to timing t31 shown in FIG. 7 as needed.

If the memory-system basic information MBI has not been correctly received, the control unit 130 of the host 100 determines that there was a failure in the communication channel CCH2 and performs a retry of the half-duplex mode that is a retry of the third step.

The retry of the half-duplex mode is performed as shown in FIG. 5. The capability of the host basic information HBI is set at the half-duplex mode. In the half-duplex mode, the communication channel CCH2 is turned off. By this means, one channel worth of power consumption of communication circuitry can be saved. Although FIG. 5 illustrates the case where the communication channel CCH1 is used with the communication channel CCH2 being off, the communication channel CCH2 may be used with the communication channel CCH1 being off.

During the period from timings t24 to t25, the host basic information HBI is transmitted from the control unit 130 of the host 100 to the control unit 30 of the memory system 1 via the communication channel CCH1. During the period from timings, t25 to t26, the control of switching the communication direction of the communication channel CCH1 from the direction of the host 100 to the memory system 1 to the direction of the memory system 1 to the host 100 is performed in each of the control unit 130 of the host 100 and the control unit 30 of the memory system 1. During the period from timings t26 to t27, the memory-system basic information MBI is transmitted from the control unit 30 of the memory system 1 to the control unit 130 of the host 100 via the communication channel CCH1.

Immediately after timing t27, the control unit 130 of the host 100 determines whether the memory-system basic information MBI has been correctly received. For example, the control unit 130 of the host 100 performs a CRC check using the CRC code included in the received memory-system basic information MBI. When succeeding in the CRC check, the control unit 130 of the host 100 can determine that the memory-system basic information MBI has been correctly received. When failing in the CRC check, the control unit 130 of the host 100 can determine that the memory-system basic information MBI has not been correctly received.

If the memory-system basic information MBI has been correctly received, the control unit 130 of the host 100 adopts the half-duplex communication for communication from this point forward, using the communication channel CCH1 as the transmission/reception dual-purpose channel. If not having received a request for another retry from the host 100 within a predetermined period after finishing transmitting the memory-system basic information MBI, the control unit 30 of the memory system 1 adopts the half-duplex communication for communication from this point forward, using the communication channel CCH1 as the reception and transmission dual-purpose channel (S2).

Then the control unit 130 of the host 100 proceeds to the sequence subsequent to timing t31 shown in FIG. 7B as needed.

If the memory-system basic information MBI has not been correctly received (or error information ERR is received), the control unit 130 of the host 100 determines that there was a failure in the communication channel CCH1 and displays an error message.

When an error occurs in packet exchange at startup, there is a high possibility that the error packet could not be received if an error packet were transmitted, and hence an example implementation is possible where, if a packet error occurs, no response is returned until communication is established and where, after a communication path is established, an error packet ERR (see FIG. 6) is returned.

It should be noted that the memory system 1 may be configured such that the memory system 1 can be mounted facing in a first direction in the host 100 and can also be mounted facing in a second direction opposite to the first direction in the host 100. When being mounted facing in the first direction in the host 100, the memory system 1 is located such that the coupler (CC1) 21 is opposite the coupler (HC1) 121, and the coupler (CC2) 22 is opposite the coupler (HC2) 122. A pair of the coupler (HC1) 121 and the coupler (CC1) 21 forms the communication channel CCH1 (the reception channel of the memory system 1), and a pair of the coupler (HC2) 122 and the coupler (CC2) 22 forms the communication channel CCH2 (the transmission channel of the memory system 1). When being mounted facing in the second direction in the host 100, the memory system 1 is located such that the coupler (CC1) 21 is opposite the coupler (HC2) 122, and the coupler (CC2) 22 is opposite the coupler (HC1) 121. A pair of the coupler (HC1) 121 and the coupler (CC2) 22 forms the communication channel CCH1' (the reception channel of the memory system 1), and a pair of the coupler (HC2) 122 and the coupler (CC1) 21 forms the communication channel CCH2' (the transmission channel of the memory system 1). In this case, the control unit 30 (the physical layer interface 31) of the memory system 1 may put both the coupler (CC1) 21 and the coupler (CC2) 22 in a reception state at first (in the period until timing t4 of FIG. 3) and determine the coupler which received a packet first (at timing t4) to be the reception channel.

Because the standard of communication is extended as years pass, a mechanism to deal with this extension is necessary. The mechanism for making communication functions extendable is controlled by the exchange of basic information (the host basic information HBI, the memory-system basic information MBI) as shown in FIG. 7. Mainly parts common to the case where the control unit has succeeded in a retry of the full-duplex mode (see FIG. 3) or a retry of the non-overlap-type full-duplex mode (see FIG. 4) (the full-duplex mode shown in FIG. 7A) and the case where the control unit has succeeded in a retry of the half-duplex mode (see FIG. 5) (the half-duplex mode shown in FIG. 7B) will be described.

Immediately before timing t31 shown in FIG. 7, the control unit 130 of the host 100 determines whether to go into an extended mode. That is, the control unit 130 of the host 100 compares information indicating the capabilities of communication (communication speed, communication frequencies, and a communication protocol) of the memory system 1 included in the received memory-system basic information MBI with information indicating the capabilities of communication of the host 100. The control unit 130 of the host 100, considering also the priorities of the capabilities included in the received memory-system basic information MBI, searches for a capability of a high priority from among capabilities common to the memory system 1 and the host 100 or a capability that makes higher-speed communication possible.

If determining that they are to go into the extended mode according to the result of the search, the control unit 130 of the host 100 creates a capability list CLIST including a plurality of capabilities to be adopted for the extended mode. If determining that they are not to go into the extended mode for some capabilities according to the result of the search, the control unit 130 of the host 100 creates a capability list CLIST in which default capabilities are used for the some capabilities. The capability list CLIST may be a fixed-length packet or defined as a variable-length packet in order to be able to extend the capabilities.

It should be noted that the host 100 first acquires the capabilities of the memory system 1 from the memory-system basic information MBI. The host 100 checks them against the capabilities of the host 100, determines capabilities to be adopted, and sends them in the capability list CLIST to the memory system 1. Hence, all the capabilities of the host 100 need not be set in the host basic information HBI. It suffices that the FD (full-duplex) capability and overlap-type capability are all the capabilities included in the host basic information HBI to be transmitted from the host 100 to the memory system 1 as shown in FIG. 6. Thus, the packet length of the host basic information HBI can be made shorter.

During the period from timings t31 to t32 shown in FIG. 7, the control unit 130 of the host 100 transmits the capability list CLIST to the control unit 30 of the memory system 1 via the communication channel CCH1. The control unit 30 of the memory system 1 receives the capability list CLIST from the control unit 130 of the host 100 via the communication channel CCH1.

During the period from timings t32 to t33, the control unit 30 of the memory system 1 determines whether the communication capabilities included in the capability list CLIST are acceptable and creates response information CACK including the determining result. Because the capabilities of the memory system 1 have been already sent in the memory-system basic information MBI, the capability list CLIST ought to contain capabilities acceptable for the two, and hence response information CACK indicating being acceptable is usually returned.

In the case of the full-duplex mode (FIG. 7A), during the period from timings t33 to t34, the control unit 30 of the memory system 1 transmits response information CACK to the control unit 130 of the host 100 via the communication channel CCH2. The control unit 130 of the host 100 receives the response information CACK from the control unit 30 of the memory system 1 via the communication channel CCH2.

In the case of the half-duplex mode (FIG. 7B), during the period from timings t33 to t34, the control of switching the communication direction of the communication channel CCH1 from the direction of the host 100 to the memory system 1 to the direction of the memory system 1 to the host 100 is performed in each of the control unit 130 of the host 100 and the control unit 30 of the memory system 1. After the switching control finishes, the control unit 30 of the memory system 1 transmits response information CACK to the control unit 130 of the host 100 via the communication channel CCH1. The control unit 130 of the host 100 receives the response information CACK from the control unit 30 of the memory system 1 via the communication channel CCH1.

At timing t34, the control unit 130 of the host 100 determines whether the adopted capabilities have been accepted by the memory system 1 according to the determining result of the memory system 1 included in the received response information CACK.

If all the capabilities adopted by the host 100 are a capability for the default mode, or if the capabilities adopted by the host 100 have not been accepted by the memory system 1, the sequence of timings t35 to t40 may be omitted.

If the capabilities adopted by the host 100 are capabilities for the extended mode, and the capabilities adopted are accepted by the memory system 1, then the host 100 and the memory system 1 execute the sequence subsequent to timing t35 to go into the extended mode. During the period from timings t35 to t40, an extended mode switching sequence is executed. During the period from timings t35 to t36, a period of time is secured as a switching preparation period. During the period from timings t36 to t40, a confirmation sequence after switching to the extended mode is executed. During the period from timings t36 to t40, the host 100 sends the capability list CLIST and correctly receives the response information CACK, thereby confirming that switching to the extended mode has been performed correctly. If succeeding in a CRC check of the response information CACK (confirming that switching to the extended mode has been performed correctly), from timing t40 forward, the communication of upper packets is performed in the extended mode. Although an example where the capability list CLIST and the response information CACK are used is shown as the confirmation sequence, any packet may be used, and if packet exchange between the host 100 and the memory system 1 is successful, going into the extended mode may be taken as being successful.

At timing t35, the control unit 130 of the host 100 changes the level of the power supply voltage supplied to the memory system 1 from the second level V2 to the third level V3 in order to notify that the memory system 1 is to go into the extended mode. The third level V3 is between the first level V1 and the second level V2 and is, for example, a level in the middle (M level, e.g., 1.8 V) between the L level (GND level) and the H level (e.g., 3.3 V).

At timing t36, the control unit 130 of the host 100 changes back the level of the power supply voltage supplied to the memory system 1 from the third level V3 to the second level V2 in response to a predetermined period of time or longer passing from timing t35. The control unit 30 of the memory system 1 recognizes the rising edge at timing t36 of the waveform of the power supply voltage (VDD) as a trigger to instruct it to go into the extended mode. The control unit 30 of the memory system 1 gets into a state of waiting to go into the extended mode in response to the trigger to instruct it to go into the extended mode. By using a change in the power supply voltage, the host 100 and the memory system 1 can be made to simultaneously start operating in the extended mode and thus can be synchronized.

During the period from timings t37 to t38 shown in FIG. 7, communication is performed in the set extended mode, and the control unit 130 of the host 100 transmits the capability list CLIST that is the same as was transmitted during the period from timings t31 to t32 to the control unit 30 of the memory system 1 via the communication channel CCH1. The control unit 30 of the memory system 1 receives the capability list CLIST from the control unit 130 of the host 100 via the communication channel CCH1.

During the period from timings t38 to t39, the control unit 30 of the memory system 1 transmits response information CACK in the set extended mode if the capability list CLIST could be recognized in the set extended mode.

In the case of the full-duplex mode (FIG. 7A), during the period from timings t39 to t40, the control unit 30 of the memory system 1 transmits response information CACK to the control unit 130 of the host 100 via the communication channel CCH2. The control unit 130 of the host 100 receives the response information CACK from the control unit 30 of the memory system 1 via the communication channel CCH2.

In the case of the half-duplex mode (FIG. 7B), during the period from timings t39 to t40, the control of switching the communication direction of the communication channel CCH1 from the direction of the host 100 to the memory system 1 to the direction of the memory system 1 to the host 100 is performed in each of the control unit 130 of the host 100 and the control unit 30 of the memory system 1. After the switching control finishes, the control unit 30 of the memory system 1 transmits response information CACK to the control unit 130 of the host 100 via the communication channel CCH1. The control unit 130 of the host 100 receives the response information CACK from the control unit 30 of the memory system 1 via the communication channel CCH1.

Then, when the level of the power supply voltage changes to the third level V3 (t35), the control unit 30 of the memory system 1 starts preparation for switching the mode of communication operation of the memory system 1 to the extended mode agreeing with the capability list CLIST, and when the level of the power supply voltage changes back to the second level V2 (t36), goes into the extended mode to start communication. When changing back the level of the power supply voltage from the third level V3 to the second level V2 (t36), the control unit 130 of the host 100 switches the mode of communication operation of the host 100 to the extended mode agreeing with the capability list CLIST to start communication. For example, a change of radio frequencies, a change of communication speed, a change of the upper layer protocol, or the like is possible.

Thus, in the case of the full-duplex mode (FIG. 7A), the control unit 130 of the host 100 establishes the communication channels CCH1, CCH2 of full-duplex communication agreeing with the extended mode. The control unit 30 of the memory system 1 establishes the communication channel CCH1 as a reception channel agreeing with the extended mode and the communication channel CCH2 as a transmission channel agreeing with the extended mode (S2').

In the case of the half-duplex mode (FIG. 7B), the control unit 130 of the host 100 establishes the communication channel CCH1 of half-duplex communication agreeing with the extended mode. The control unit 30 of the memory system 1 establishes the communication channel CCH1 as a reception and transmission dual-purpose channel agreeing with the extended mode (S2').

As described above, in the first embodiment, when the memory system 1 is mounted in the host 100, in the memory system 1, the power supply line VL of the host 100 is connected to the power supply terminal (VDD) 23 to supply power to, and the couplers 21, 22 are electromagnetically coupled to the couplers of the host 100 respectively. The control unit 30 can establish a reception channel and a transmission channel that are independent of each other with the host 100 via the plurality of couplers 21, 22. Thus, for the P2P connection between the memory system 1 and the host 100, the near-field radio communication using electromagnetic coupling can be performed in full-duplex communication, and hence the influence of the physical characteristics of the communication path can be suppressed, and communication can be performed without performing communication-direction switching control. As a result, the speed of data transfer between the memory system 1 and the host 100 can be easily made higher.

Further, in the first embodiment, because communication between the memory system 1 and the host 100 is performed by the near-field radio communication that does not use a carrier wave, power is not steadily consumed on each of the transmission side and the reception side, and because energy is hardly consumed on the secondary side (reception side) when the transmission side and the reception side are not within a predetermined short distance of each other, the memory system 1 can be easily made lower in power consumption.

Yet further, in the first embodiment, the couplers 21, 22, 121, 122 are each configured such that communication interference between the plurality of sets of couplers electromagnetically coupled is suppressed. For example, the coupler (CC1) 21 and the coupler (CC2) 22 are placed a predetermined short distance or longer apart in the connector 20. The coupler (HC1) 121 and the coupler (HC2) 122 are placed a predetermined short distance or longer apart in the connector 120. For example, the plurality of couplers 21, 22 each have directivity, and the plurality of couplers 121, 122 each have directivity. For example, the frequencies of electromagnetic waves (an RF signal) by which the coupler (CC1) 21 and the coupler (HC1) 121 communicate and those of electromagnetic waves (an RF signal) by which the coupler (CC2) 22 and the coupler (HC2) 122 communicate are made different from each other. Thus, a plurality of communication channels can be established with the plurality of sets of couplers electromagnetically coupled, so that interference between the plurality of communication channels can be reduced, and hence the communication path can be easily made full-duplex.

Still further, in the first embodiment, the control unit 30 of the memory system 1 receives sequentially the host basic information HBI about the capabilities of the host 100 and test symbols TS from the host 100 via the first communication channel in response to the level of the power supply voltage supplied from the host 100 changing from the first level V1 (L level) to the second level V2 (H level). The control unit 30 of the memory system 1 transmits the memory-system basic information MBI about the capabilities of the memory system 1 to the host 100 via the second communication channel while receiving the test symbols TS via the first communication channel. Then the control unit 30 of the memory system 1 sets the first communication channel as a reception channel and the second communication channel as a transmission channel in response to correctly receiving the host basic information HBI. Thus, mutual interference between the reception channel and the transmission channel can be checked for, and if the level of mutual interference between the reception channel and the transmission channel is within a permissible range, the communication path in full-duplex mode can be established between the memory system 1 and the host 100.

In the first embodiment, if receiving the capability list CLIST of capabilities to be adopted by the host 100 from among the capabilities included in the memory-system basic information MBI from the host 100 via the first communication channel, the control unit 30 of the memory system 1 transmits response information CACK indicating the memory system 1 having accepted the capability list CLIST to the host 100 via the second communication channel. The control unit 30 of the memory system 1 switches the mode of communication operation of the memory system 1 to the extended mode agreeing with the capability list CLIST in response to the level of the power supply voltage supplied from the host 100 changing from the second level V2 (H level) to the third level V3 (M level) back to the second level V2 (H level) again. If receiving the capability list CLIST from the host 100 via the first communication channel, the control unit 30 of the memory system 1 transmits response information CACK to the host 100 via the second communication channel, thereby establishing the first communication channel as the reception channel agreeing with the extended mode and the second communication channel as the transmission channel agreeing with the extended mode. Thus, if the standard of communication is extended, the communication functions of the communication path between the memory system 1 and the host 100 can be easily extended.

Second Embodiment

Next, a memory system according to the second embodiment will be described. Description will be made below focusing on the differences from the first embodiment.

Since the communication between the memory system 1 and the host 100 is performed by the near-field radio communication, lower power consumption is easily achieved. In the second embodiment, tactics in the communication method for further pursuing lower power consumption will be described.

The communication of the upper layer between the memory system 1 and the host 100 is performed by exchanging upper-layer packets using the default upper-layer communication protocol. The communication protocol can be changed later.

Figure 8:
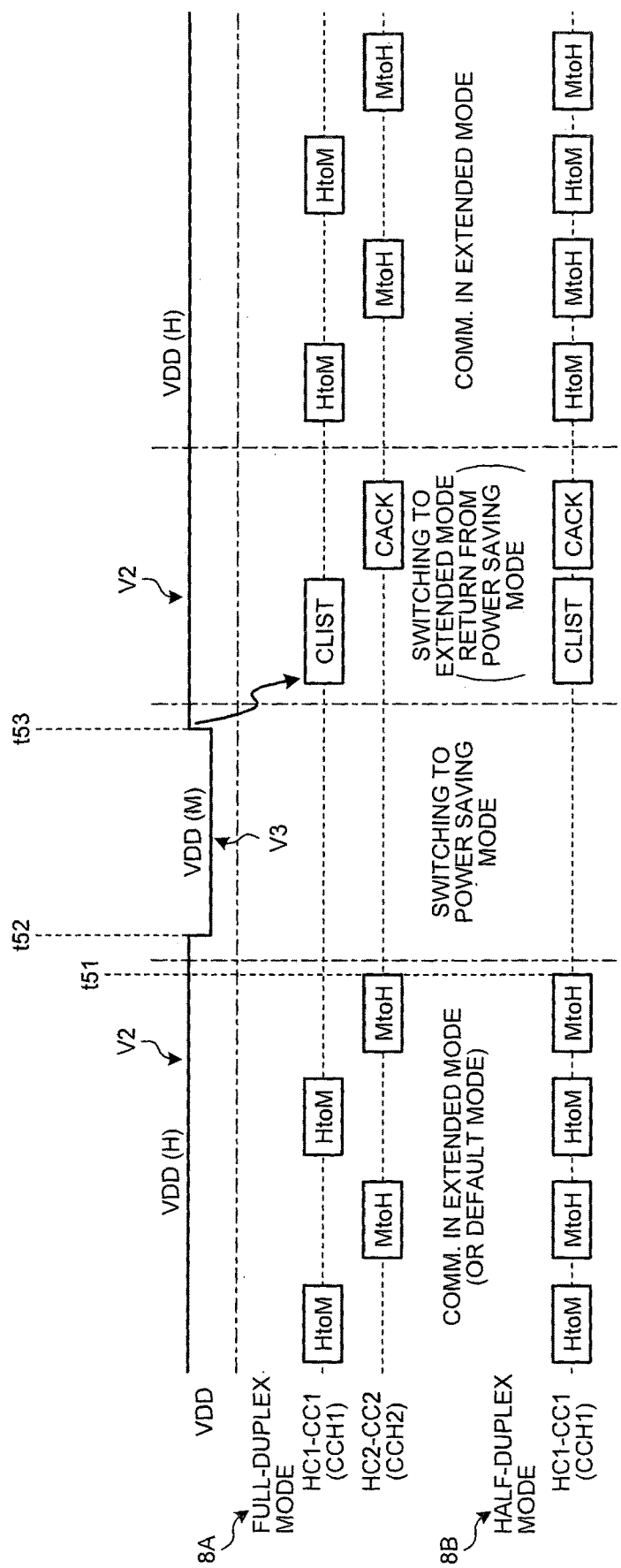
FIG. 8 is a diagram showing a sequence of going into a power saving mode and a sequence of returning from the power saving mode in a second embodiment.

For example, in FIG. 8, "HtoM" denotes an upper-layer packet being sent from the host 100 to the memory system 1, and "MtoH" denotes an upper-layer packet being sent from the memory system 1 to the host 100. FIG. 8 is a diagram showing a sequence of going into a power saving mode and a sequence of returning from the power saving mode. As shown in FIG. 8, the host 100 transmits an upper-layer packet (HtoM) to the memory system 1, so that transaction is started, and when a transaction completion packet (MtoH) is notified from the memory system 1 to the host 100, the transaction finishes. While the transaction is being performed, the host 100 and the memory system 1 are operating.

In contrast, when the transaction is not performed, by having the memory system 1 go into the power saving mode, some circuits of the memory system 1 can be made to rest, so that the memory system 1 can be expected to be further lower in power consumption. The timing when to go into the power saving mode can be determined by the upper layer of the host 100 (the upper layer interface 132) that controls the transaction.

When the memory system 1 is not going to be used for some time, or so on, the control unit 130 of the host 100 cuts off the communication channel and has the memory system 1 go into the power saving mode. At this time, the control unit 130 of the host 100 changes the level of the power supply voltage from the second level V2 to the third level V3, thereby instructing the memory system 1 to go into the power saving mode in parallel with cutting off the communication channel, so that the communication protocol can be simplified.

For example, consider the case where, as shown in FIG. 8, at timing t51, the control unit 130 of the host 100 (the upper layer interface 132) perceives the transaction completion and determines not to use the memory system 1 for some time. The "HtoM" packet immediately before timing t51 includes information to request to enter the power saving mode, and the "MtoH" packet includes information indicating that the operation of the memory system 1 can be stopped (it can enter the power saving mode). The control unit 130 of the host 100 determines based on this information that it is possible to have the memory system 1 go into the power saving mode.

At timing t52, the control unit 130 of the host 100 (power supply control unit 136) lowers the level of the power supply voltage supplied to the memory system 1 from the second level V2 (H level) to the third level V3 (M level), thereby having both the host 100 and the memory system 1 go into the power saving mode.

It is supposed that, immediately before timing t53, the host 100 (upper layer interface 132) starts needing to use the memory system 1 again.

Accordingly, at timing t53, the control unit 130 of the host 100 (power supply control unit 136) changes the level of the power supply voltage supplied to the memory system 1 from the third level V3 (M level) back to the second level V2 (H level), thereby having both the host 100 and the memory system 1 go into the original mode (the extended mode or default mode).

Then the same sequence as that of timings t37 to t40 shown in FIG. 7 is executed, so that the communication channel agreeing with the extended mode is established again. For example, in the case of the full-duplex mode (FIG. 8A), the same sequence as that of timings t37 to t40 shown in FIG. 7A is executed. In the case of the half-duplex mode (FIG. 8B), the same sequence as that of timings t37 to t40 shown in FIG. 7B is executed. Switching to the extended mode and returning from the power saving mode are performed by changing the level of the power supply voltage from the third level V3 to the second level V2, and by using the same sequence as that of timings t37 to t40 shown in FIG. 7, the specification is standardized. Note that the same sequence does not necessarily need to be used in returning from the power saving mode, but that other packets may be exchanged or the sequence of timings t37 to t40 may be omitted.

As such, because the power supply voltage (VDD(M)) of the third level V3 (M level) is applied to the memory system 1 during the period from timings t52 to t53, the memory system 1 can quickly return to the state of being able to exchange upper-layer packets after timing t53. Further, the memory system 1 can hold states and information in the power saving mode with use of an internal circuit continuing to operate with the power supply voltage (VDD(M)) of the third level V3 (M level).

As described above, in the second embodiment, after establishing the reception channel and the transmission channel, the control unit 30 of the memory system 1 has the communication operation of the memory system 1 go from the extended mode into the power saving mode in response to the level of the power supply voltage supplied from the host 100 via the power supply terminal 23 changing from the second level V2 (H level) to the third level V3 (M level). Thus, some circuits of the memory system 1 in the power saving mode can be made to rest, so that the memory system 1 can be made further lower in power consumption. Further, because the host 100 can instruct the memory system 1 to go into the power saving mode without using a communication channel, the host 100 can instruct the memory system 1 to go into the power saving mode in parallel with cutting off the communication channel, so that the communication protocol can be simplified.

In the second embodiment, the control unit 30 of the memory system 1 has the communication operation of the memory system 1 return from the power saving mode to the extended mode in response to the level of the power supply voltage supplied from the host 100 via the power supply terminal 23 returning from the third level V3 to the second level V2. Thus, because the host 100 can instruct the memory system 1 to return from the power saving mode without using a communication channel, the host 100 can instruct the memory system 1 to return from the power saving mode in parallel with resuming the communication channel, so that the communication protocol can be simplified.

Figure 9:
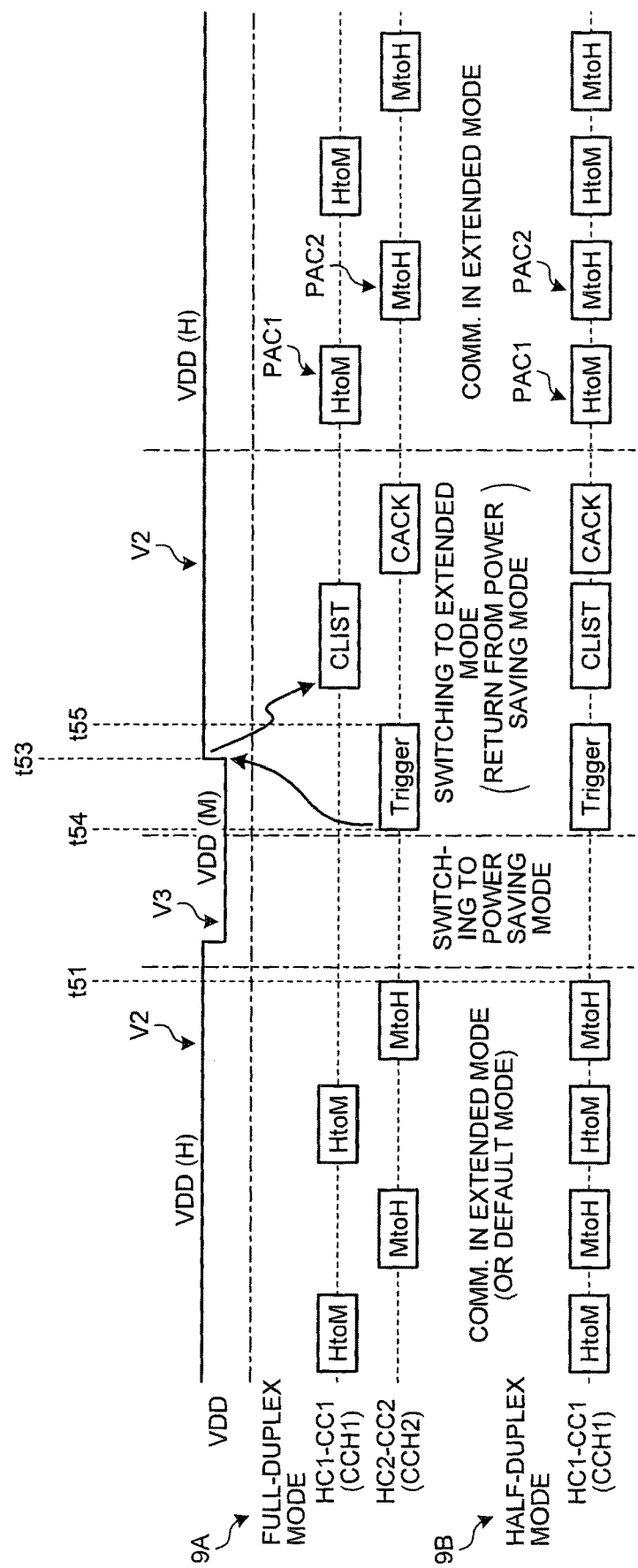
FIG. 9 is a diagram showing a sequence of going into the power saving mode and a sequence of returning from the power saving mode in a modified example of the second embodiment.

It should be noted that the memory system 1 may request the host 100 to have it return from the power saving mode to the original mode (the extended mode or default mode) as shown in FIG. 9. This operation is called wakeup. FIG. 9 is a diagram showing a sequence of going into the power saving mode and a sequence of returning from the power saving mode.

For example, the "HtoM" packet immediately before timing t51 includes information that the host permits the use of the wakeup, and the "MtoH" packet includes information indicating that the memory system 1 uses the wakeup. Where the wakeup is performed, after they go into the power saving mode, the host 100 puts, for the full-duplex mode (see FIG. 9A), the communication channel CCH2 or, for the half-duplex mode (see FIG. 9B), the communication channel CCH1 as a reception channel in the state of being able to detect a trigger signal.

For example, as shown in FIG. 9, immediately before timing t54 an event occurs in the memory system 1, so that the control unit 30 of the memory system 1 determines that there has occurred a need to resume communication so as to request the host 100 to process.

During the period from timings t54 to t55, the control unit 30 of the memory system 1 transmits the trigger signal Trigger to the host 100 using the communication channel (the communication channel CCH2 for the full-duplex mode or the communication channel CCH1 for the half-duplex mode). As the trigger signal 'Trigger', electromagnetic variation can be used. Thus, there is no need to recognize information like a packet, and the transmitting circuit of the memory system 1 emits weak electromagnetic energy, and the receiving circuit of the host 100 detects it. For example, by using a specific frequency or transmitting the trigger signal 'Trigger' for a certain time or longer, magnetic variation due to noise can be recognized and excluded. That is, the trigger signal pattern which can be identified as being obviously different from variation due to noise is used for the trigger signal 'Trigger'. Event transmission/reception does not need the power supply voltage (VDD(H)) of the second level. V2, but operates with the power supply voltage (VDD (M)) of the third level V3. For example, the memory system 1 continues emitting the trigger signal 'Trigger' until detecting the power supply voltage (VDD(H)) of the second level V2.

While applying the power supply voltage (VDD(M)) of the third level V3 to the memory system 1, which may emit the trigger signal 'Trigger', the host 100 needs to make the circuit for detecting weak electromagnetic variation continue operating, but only some circuits operate. Hence, as compared with the method of detecting an event by polling, power consumption can be greatly lowered.

In response to receiving the trigger signal 'Trigger', at timing t53, the control unit 130 of the host 100 (power supply control unit 136) changes the level of the power supply voltage supplied to the memory system 1 from the third level V3 (M level) back to the second level V2 (H level), thereby having both the host 100 and the memory system 1 go into the original mode (the extended mode or default mode).

At timing t55, in response to detecting the power supply voltage (VDD(H)) of the second level V2, the memory system 1 finishes transmitting the trigger signal 'Trigger'.

Then the same sequence as that of timings t37 to t40 shown in FIG. 7 is executed, so that the communication channel agreeing with the extended mode is established again.

The packet PAC1 shown in FIG. 9 is a packet to inquire of the memory system 1 what event has occurred. The packet PAC2 is a packet in which the memory system 1 provides information that the host 100 needs in event processing for the host 100. The trigger signal 'Trigger' is means for notifying an event to the host 100 during non-operation, and during operation, the occurrence of an event can be notified to the host 100 by making event information be included in an upper-layer packet to be sent from the memory system 1 to the host 100.

As such, while the level of the power supply voltage supplied from the host 100 via the power supply terminal 23 is the third level V3, the control unit 30 of the memory system 1 transmits the trigger signal 'Trigger' to the host 100 via the second communication channel. The control unit 30 of the memory system 1 has the communication operation of the memory system 1 return from the power saving mode to the extended mode in response to the level of the power supply voltage supplied from the host 100 via the power supply terminal 23 returning from the third level V3 to the second level V2 in response to the trigger signal 'Trigger'. As such, the memory system 1 can request the host 100 to have it return from the power saving mode to the original mode (the extended mode or default mode).

Third Embodiment

Next, a memory system according to the third embodiment will be described. Description will be made below focusing on the differences from the first embodiment.

Since the communication between the memory system 1 and the host 100 is performed by the near-field radio communication, lower power consumption is easily achieved. In the third embodiment, tactics in the configuration for further pursuing lower power consumption will be described.

The supply power for the memory system 1 is supplied from the host 100 to the memory system 1. Hence, the host 100 can control the power consumption of the memory system 1 using the level of the power supply voltage to be supplied to the memory system 1.

The voltage of the power supply terminal (VDD) 23 of the memory system 1 is supplied from the host 100 and can take on three levels: a first level V1, a third level V3, and a second level V2 with respect to GND level that is the voltage on the ground terminal (GND) 24. The first level V1 is, for example, the L level GND level). The second level V2 is higher than both the first level V1 and the third level V3 and, for example, is the H level. The third level V3 is between the first level V1 and the second level V2 and, for example, is the M level.

Figure 10:
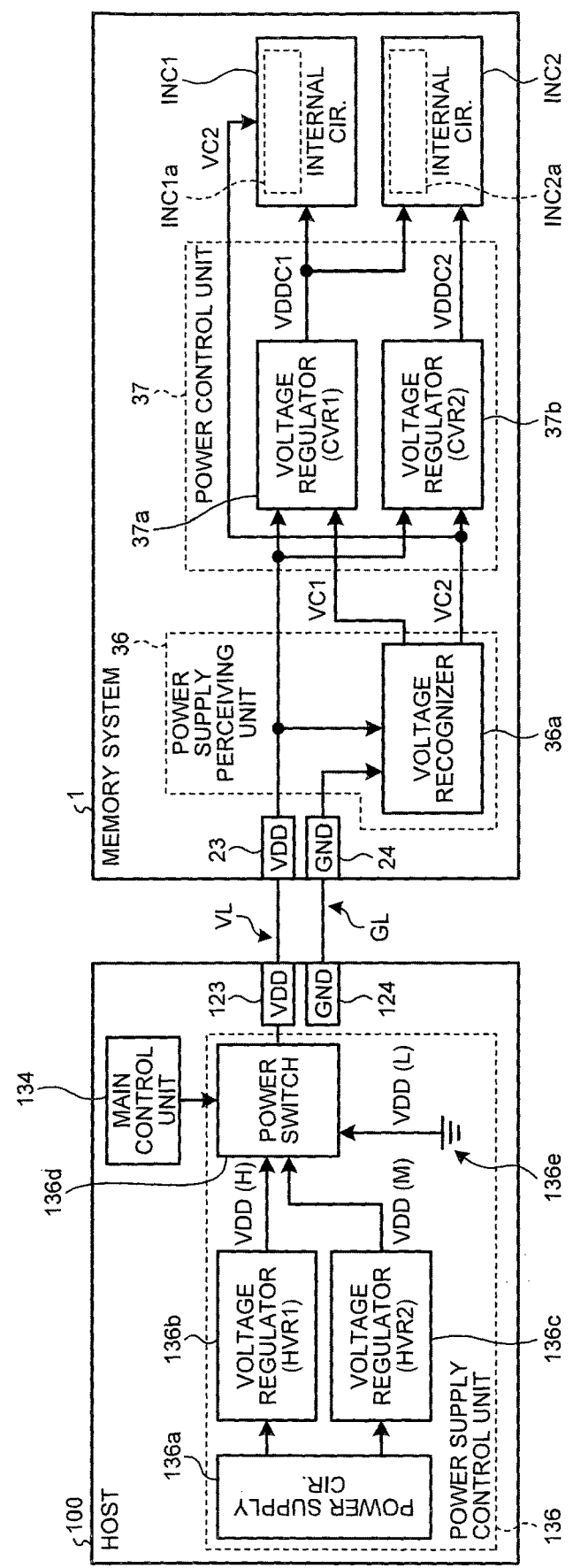
FIG. 10 is a diagram showing the configuration for power control in a third embodiment.

In the host 100, the power supply control unit 136 has a power supply circuit 136*a*, a voltage regulator (HVR1) 136*b*, a voltage regulator (HVR2) 136*c*, and a power switch 136*d* as shown in, e.g., FIG. 10. FIG. 10 is a diagram showing the configuration for power control. The power supply circuit 136*a* (e.g., a battery or a converter converting commercial alternating-current power into a direct-current voltage) generates a power supply voltage to supply to the voltage regulator (HVR1) 136*b* and voltage regulator (HVR2) 136*c*. The voltage regulator (HVR1) 136*b* adjusts the level of the power supply voltage supplied from the power supply circuit 136*a* to generate a power supply voltage (VDD (H)) of the second level V2 so as to supply the generated power supply voltage (VDD (H)) to the power switch 136*d*. If the output voltage of the power supply circuit 136*a* is of the stabilized second level V2 (VDD(H)), the voltage regulator (HVR1) 136*b* may be unnecessary. The voltage regulator (HVR2) 136*c* adjusts the level of the power supply voltage supplied from the power supply circuit 136*a* to generate a power supply voltage (VDD(M)) of the third level V3 so as to supply the generated power supply voltage (VDD(M)) to the power switch 136*d*. Ground potential 136*e* supplies a power supply voltage (VDD(L)) of the first level V1 to the power switch 136*d*. The power switch 136*d*, according to the control of the main control unit 134, selects one of power supply voltages of the first level V1, the third level V3, and the second level V2 to supply to the power supply terminal (VDD) 23 of the memory system 1 via the power supply terminal (VDD) 123 and the power supply line VL.

The memory system 1 has an internal circuit INC1 and an internal circuit INC2. The internal circuit INC1 is a running circuit that continues operating even in the power saving mode, and includes communication circuits such as the physical layer interface 31 and the communication control unit 33 (see FIG. 1). The internal circuit INC2 is an intermittent circuit that rests in the power saving mode, and includes, for example, the memory interface 35 (see FIG. 1) and the like.

The power supply perceiving unit 36 perceives the level of the power supply voltage supplied from the host 100 via the power supply terminal 23 and the ground terminal 24. The power supply perceiving unit 36 has a voltage recognizer 36*a*. The voltage recognizer 36*a* recognizes the level of the power supply voltage supplied from the host 100 via the power supply terminal 23 using a first reference level Vref1 and a second reference level Vref2. The second reference level Vref2 is higher than the first reference level Vref1. The first reference level Vref1 and second reference level Vref2 can be set so as to satisfy, e.g., V1 (L level) <Vref1<V3 (M level)<Vref2<V2 (H level).

If the level of the power supply voltage supplied from the host 100 is less than the first reference level Vref1 (e.g., at V1 (L level)), then the voltage recognizer 36*a* outputs a control signal VC1=0 and a control signal VC2=0. If the level of the power supply voltage supplied from the host 100 is greater than or equal to the first reference level Vref1 and less than the second reference level Vref2 (e.g., at V3 (M level)), then the voltage recognizer 36*a* outputs the control signal VC1=1 and the control signal VC2=0. If the level of the power supply voltage supplied from the host 100 is greater than or equal to the second reference level Vref2 (e.g., at V2 (H level)), then the voltage recognizer 36*a* outputs the control signal VC1=1 and the control signal VC2=1.

The power control unit 37 operates for power control of the memory system 1 according to the level of the power supply voltage perceived by the power supply perceiving unit 36. The power control unit 37 has a voltage regulator (CVR1) 37*a* and a voltage regulator (CVR2) 37*b*.

If the level of the power supply voltage supplied from the host 100 is greater than or equal to the first reference level Vref1, the voltage regulator (CVR1) 37*a* generates a first internal voltage VDDC1 to supply to each, of the internal circuits INC1 and INC2. The first internal voltage VDDC1 is used by circuits operating, and registers/memories holding information, in the power saving mode. If the level of the power supply voltage supplied from the host 100 is less than the first reference level Vref1, the voltage regulator (CVR1) 37*a* stops operating. The voltage regulator (CVR1) 37*a* receives the control signal VC1 from the voltage recognizer 36*a*. When the control signal VC1=1, the voltage regulator (CVR1) 37*a* generates the first internal voltage VDDC1 to supply to each of the internal circuits INC1 and INC2 and stops operating when the control signal VC1=0. That is, the voltage recognizer 36*a* controls the on/off of the voltage regulator (CVR1) 37*a* via the control signal VC1.

If the level of the power supply voltage supplied from the host 100 is greater than or equal to the second reference level Vref2, the voltage regulator (CVR2) 37*b* generates a second internal voltage VDDC2 to supply to the internal circuit INC2. The second internal voltage VDDC2 is higher than the first internal voltage VDDC1. If the level of the power supply voltage supplied from the host 100 is less than the second reference level Vref2, the voltage regulator (CVR2) 37*b* stops operating. The voltage regulator (CVR2) 37*b* receives the control signal VC2 from the voltage recognizer 36*a*. When the control signal VC2=1, the voltage regulator (CVR2) 37*b* generates the second internal voltage VDDC2 to supply to the internal circuit INC2 and stops operating when the control signal VC2=0. That is, the voltage recognizer 36*a* controls the on/off of the voltage regulator (CVR3) 37*b* via the control signal VC2.

When the first internal voltage VDDC1 is supplied from the voltage regulator (CVR1) 37*a*, the internal circuit INC1 operates with use of the first internal voltage VDDC1 to perform control to establish a communication channel, for example.

While the level of the power supply voltage supplied from the host 100 is the third level V3 (M level), and the memory system 1 is in the power saving mode, the internal circuit INC1 operates with use of the first internal voltage VDDC1. Whether to be in the operating mode (VC2=1) or the power saving mode (VC2=0) is controlled via the control signal VC2. Note that the entire block of the internal circuit INC1 does not always operate and that its partial block INC1a not operating can be made to rest. Accordingly, the internal circuit INC1 may be configured to, receiving the control signal VC2 of the voltage recognizer 36a, make the block INC1a rest if the control signal VC2=0 and make the block INC1a operate if the control signal VC2=1. For example, if the control signal VC2=0 (at rest), in the internal circuit INC1, only the circuit detecting a communication start can continue operating with the others resting. If the control signal VC2=1, the internal circuit INC1 keeps communication in a connected state and, if VC2=0, can cut off connection to be in a wait state (the state of being able to detect a communication start). Thus, the power consumption of the internal circuit INC1 can be reduced.

If the level of the power supply voltage supplied from the host 100 is greater than or equal to the second reference level Vref2, the internal circuit INC2 operates with use of the second internal voltage VDDC2 and, if the level of the power supply voltage supplied from the host 100 is less than the second reference level Vref2, stops operating.

While the level of the power supply voltage supplied from the host 100 is the third level V3 (M level), and the memory system 1 is in the power saving mode, with the second internal voltage VDDC2 not being supplied to the internal circuit INC2, the internal circuit INC2 is resting and in a power saving state. Thus, the power consumption of the internal circuit INC2 can be reduced.

At this time, a storage circuit INC2a (e.g., a volatile memory or flip-flops) in the internal circuit INC2 can operate with the first internal voltage VDDC1 as backup power supply to hold states and information of the internal circuit INC2.

As described above, in the third embodiment, in the memory system 1, the voltage recognizer 36a recognizes the level of the power supply voltage supplied from the host 100 via the power supply terminal 23 using the first reference level Vref1 and the second reference level Vref2. If the level of the power supply voltage supplied from the host 100 is greater than or equal to the first reference level Vref1, the voltage regulator (CVR1) 37a generates the first internal voltage VDDC1 and, if the level of the power supply voltage supplied from the host 100 is less than the first reference level Vref1, stops operating. If the level of the power supply voltage supplied from the host 100 is greater than or equal to the second reference level Vref2, the voltage regulator (CVR2) 37b generates the second internal voltage VDDC2 higher than the first internal voltage VDDC1 and, if the level of the power supply voltage supplied from the host 100 is less than the second reference level Vref2, stops operating. If the level of the power supply voltage supplied from the host 100 is greater than or equal to the first reference level Vref1, the internal circuit INC1 operates with use of the first internal voltage VDDC1 to perform control to establish a communication channel. If the level of the power supply voltage supplied from the host 100 is greater than or equal to the second reference level Vref2, the internal circuit INC2 operates with use of the second internal voltage VDDC2 and, if the level of the power supply voltage supplied from the host 100 is less than the second reference level Vref2, stops operating. As such, while in the power saving mode, parts that are not operating and parts that need not be operated in the memory system 1 can be made to rest, and thus the power consumption of the memory system 1 can be further reduced.

Fourth Embodiment

Next, a memory system according to the fourth embodiment will be described. Description will be made below focusing on the differences from the first embodiment.

Since the communication between the memory system 1 and the host 100 is performed by the near-field radio communication, degrees of freedom of connection between the memory system 1 and the host 100 are easily improved as compared with communication using wired connection. In the fourth embodiment, tactics in the configuration of connection between the memory system 1 and the host 100 wherein the memory system 1 is a memory card will be described.

The memory system 1 and the host 100 can establish the plurality of communication channels CCH1, CCH2 (see FIG. 3) with the plurality of couplers 21, 22 and the plurality of couplers 121, 122 (see FIG. 1). That is, since the memory system 1 and the host 100 have the plurality of communication channels, the plurality of couplers are easily symmetrically arranged. Further, since the communication between the memory system 1 and the host 100 is performed by the near-field radio communication, the number of terminals to be physically connected can be reduced. Thus, where the memory system 1 is a memory card, the memory system 1 can be configured such that the memory system 1 is mountable facing in a first direction in the host 100 and also mountable facing in a second direction opposite to the first direction (reverse insertable) in the host 100. Accordingly, a notch to distinguish the first direction and the second direction with need not be provided, and hence the external shape of the memory system 1 (a memory card) can be made symmetrical.

Figure 11:
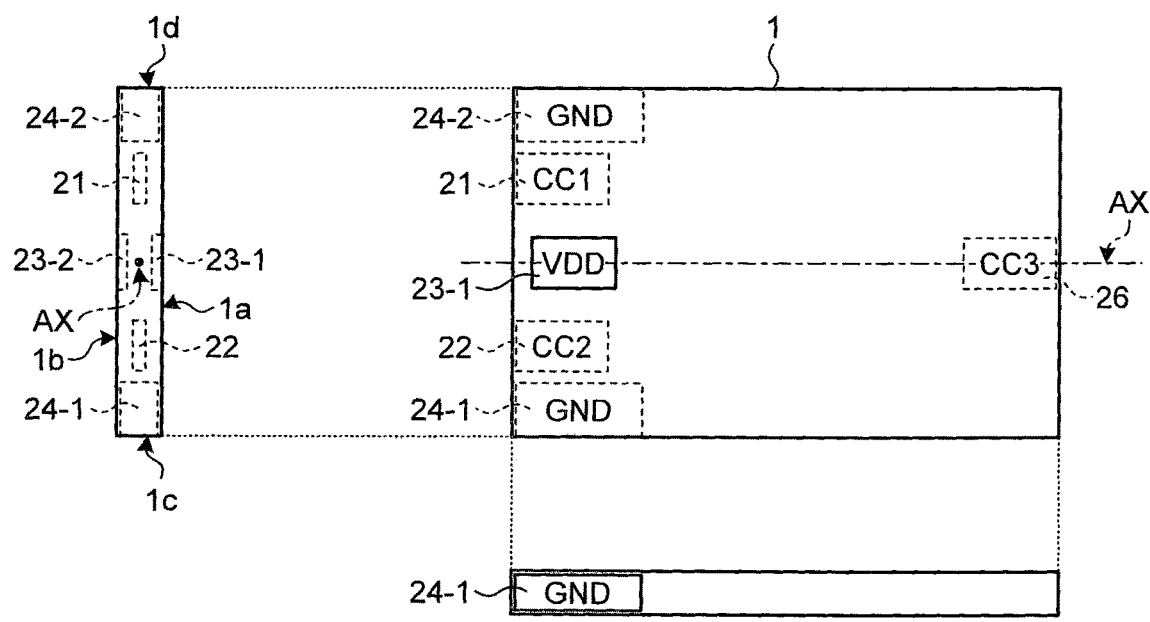
FIG. 11 is a diagram showing the configuration of a memory system (memory card) in a fourth embodiment.

For example, as shown in FIG. 11, the external shape of the memory system 1 (a memory card) is formed 180 degrees rotationally symmetrical with respect to an axis AX. FIG. 11 is a diagram showing the configuration of the memory system 1 (a memory card). The axis AX is an axis along the insertion direction in which to insert the memory system 1 (a memory card) into a card slot of the host 100.

The coupler (CC1) 21 and the coupler (CC2) 22 are provided in the memory system 1. The couplers 21, 22 are placed in positions on the host 100 side when the memory system 1 is inserted into the host 100. The couplers 21, 22 are arranged in positions 180 degrees rotationally symmetrical with respect to the axis AX. For example, the couplers 21, 22 are arranged axisymmetrical with respect to the axis AX in a plane including the axis AX and substantially parallel to a first principal surface 1a of the case of the memory system 1 (a memory card).

A coupler (CC3) 26 may be further provided in the memory system 1. The coupler 26 is placed in a position on the opposite side to the host 100 when the memory system 1 is inserted into the host 100. The coupler 26 is one to be electromagnetically coupled to a coupler 226 of a second host 200 (see FIG. 14A) separate from the host 100.

Further, a plurality of power supply terminals 23-1, 23-2 and a plurality of ground terminals 24-1, 24-2 are provided in the memory system 1. The power supply terminals 23-1, 23-2 are arranged 180 degrees rotationally symmetrical with respect to the axis AX. The power supply terminals 23-1, 23-2 are respectively placed, for example, on the first principal surface 1a and second principal surface 1b of the case of the memory system 1 (a memory card). The power supply terminals 23-1, 23-2 together function as the power supply terminal 23 (see FIG. 1).

The plurality of ground terminals 24-1, 24-2 are arranged 180 degrees rotationally symmetrical with respect to the axis AX. The ground terminals 24-1, 24-2 are respectively placed, for example, on a first side surface 1c and second side surface 1d of the case of the memory system 1 (a memory card). The ground terminals 24-1, 24-2 together function as the ground terminal 24 (see FIG. 1).

Figure 12:
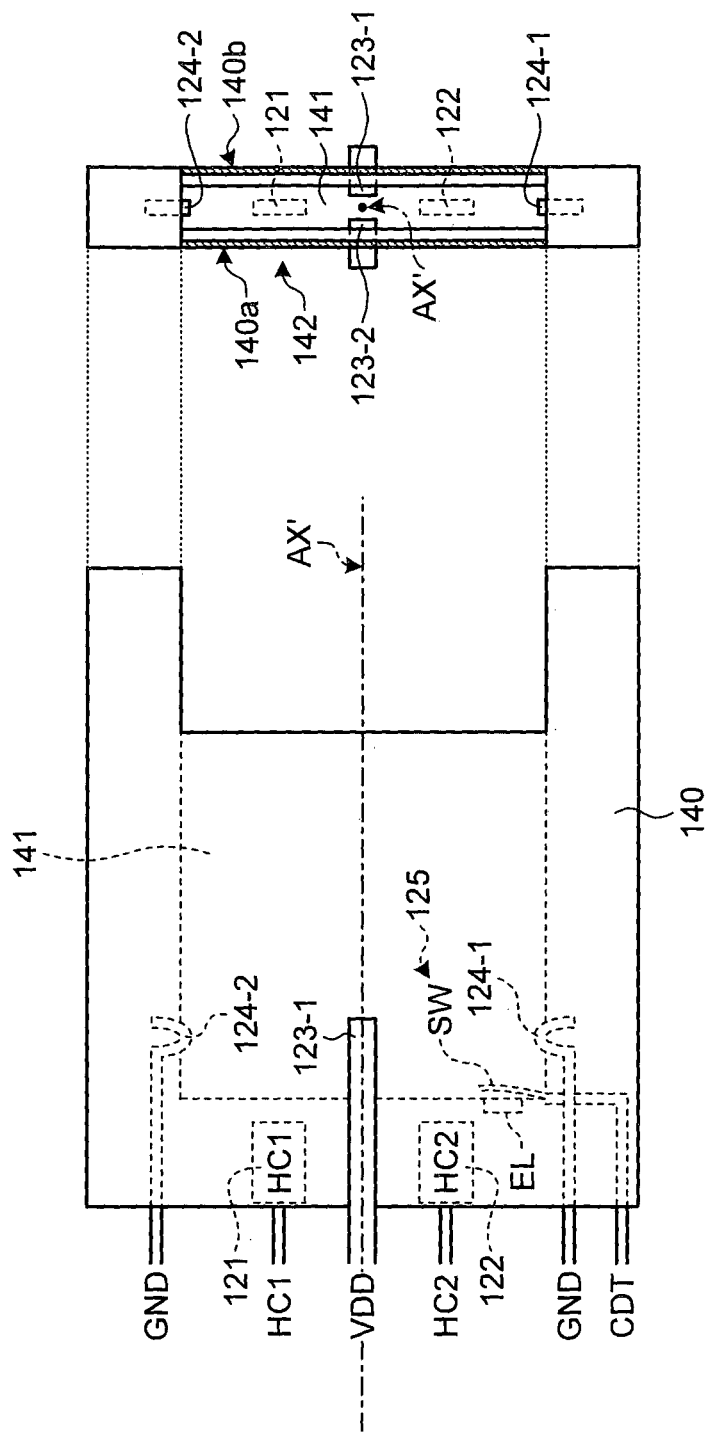
FIG. 12 is a diagram showing the configuration of a card slot of a host in the fourth embodiment.

For example, as shown in FIG. 12, a card slot 140 of the host 100 into which to insert the memory system 1 is configured to correspond to the memory system 1 (a memory card). FIG. 12 is a diagram showing the configuration of the card slot 140. The card slot 140 has a cavity 141 into which to insert the memory system 1 (a memory card). The width of the cavity 141 along the first principal surface 140a of the case of the card slot 140 corresponds to that of the memory system 1 (a memory card), and the width of the cavity 141 along the axis AX' is smaller than that of the memory system 1 (a memory card). When the memory system 1 is inserted into the card slot 140, the axis AX' substantially coincides with the axis AX of the memory system 1. The card slot 140 has the connector 120 (see FIG. 1).

The coupler (HC1) 121 and the coupler (HC2) 122 are provided in the card slot 140. The couplers 121, 122 are arranged 180 degrees rotationally symmetrical with respect to the axis AX'. The couplers 121, 122 are placed in positions that are respectively opposite the corresponding couplers 21, 22 when the memory system 1 (a memory card) is inserted into the cavity 141. For example, the couplers 121, 122 are arranged axisymmetrical with respect to the axis AX' in a plane including the axis AX' and substantially parallel to the first principal surface 140a of the case of the card slot 140.

Further, a plurality of power supply terminals 123-1, 123-2 and a plurality of ground terminals 124-1, 124-2 are provided in the card slot 140. The power supply terminals 123-1, 123-2 are respectively placed in such positions as to physically touch the corresponding power supply terminals 23-1, 23-2 when the memory system 1 (a memory card) is inserted into the cavity 141. The ground terminals 124-1, 124-2 are respectively placed in such positions as to physically touch the corresponding ground terminals 24-1, 24-2 when the memory system 1 (a memory card) is inserted into the cavity 141.

The card detecting unit (CDT) 125 is provided in the card slot 140. The card detecting unit 125 has a switch SW and an electrode EL. The switch SW has a leaf spring and is separated by the elastic force of the leaf spring from the electrode EL when the memory system 1 (a memory card) is pulled back from the cavity 141. A power supply voltage (H level) is supplied to the electrode EL via a line not shown. When the memory system 1 (a memory card) is inserted into the cavity 141, so that the end of the memory system 1 (a memory card) pushes the switch SW against the electrode EL (see FIG. 13), the switch SW to the electrode EL is rendered conductive, so that the card detecting unit (CDT) 125 can generate a detection signal CDT of the H level. Thus, when the memory system 1 is mounted in the host 100, the card detecting unit (CDT) 125 detects the to-be-touched portion 25 in the connector 20 (see FIG. 1) physically touching the card detecting unit 125.

Figure 13:
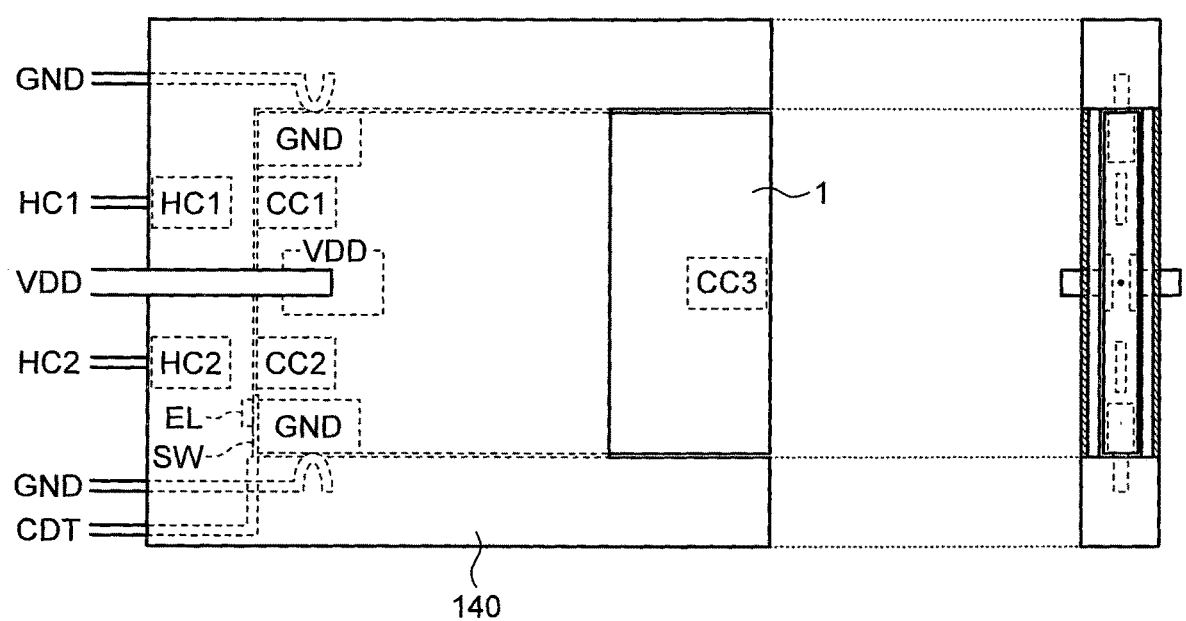
FIG. 13 is a diagram showing the configuration where the memory system (memory card) is mounted in the card slot in the fourth embodiment.

For example, as shown in FIG. 13, the memory system 1 (a memory card) is mounted (inserted) in the card slot 140.

FIG. 13 is a diagram showing the configuration where the memory system 1 (a memory card) is mounted in the card slot 140.

When the memory system 1, oriented as shown in FIG. 13, is mounted in the card slot 140 of the host 100, the coupler (CC1) 21 is located to face the coupler (HC1) 121, and the coupler (CC2) 22 is located to face the coupler (HC2) 122. Thus, the coupler (HC1) 121 and the coupler (CC1) 21 form the communication channel CCH1 (the reception channel of the memory system 1), and the coupler (HC2) 122 and the coupler (CC2) 22 form the communication channel CCH2 (the transmission channel of the memory system 1). At this time, the power supply terminals 123-1, 123-2 physically touch the power supply terminals 23-1, 23-2 respectively so as to be electrically conductive. The ground terminals 124-1, 124-2 physically touch the ground terminals 24-1, 24-2 respectively so as to be electrically conductive.

When the memory system 1, oriented in the direction 180 degrees opposite to that shown in FIG. 13 with respect to the axis AX (see FIG. 11), is mounted in the card slot 140 of the host 100, the coupler (CC1) 21 is located facing the coupler (HC2) 122, and the coupler (CC2) 22 is facing the coupler (HC1) 121. Thus, the coupler (HC1) 121 and the coupler (CC2) 22 form the communication channel CCH1' (the reception channel of the memory system 1), and the coupler (HC2) 122 and the coupler (CC1) 21 form the communication channel CCH2' (the transmission channel of the memory system 1). At this time, the power supply terminals 123-1, 123-2 physically touch the power supply terminals 23-2, 23-1 respectively so as to be electrically conductive. The ground terminals 124-1, 124-2 physically touch the ground terminals 24-2, 24-1 respectively so as to be electrically conductive.

In the sequence of establishing a communication path shown in FIG. 3, the host 100 transmits the host basic information HBI via the coupler (HC1), and the memory system 1 (e.g., a memory card) receives the host basic information HBI by either the coupler (CC1) or the coupler (CC2). Thus, the memory system 1 perceives (determines) that the coupler having received the host basic information HBI from among the coupler (CC1) and coupler (CC2) is one facing and paired with the coupler (HC1) of the host 100.

The host basic information HBI can include information specifying how to utilize the other coupler (HC2) (e.g., receive only, unused, etc.) to specify the operation of the other pair.

It should be noted that, in either case of direction, it can be made difficult for electromagnetic waves transmitted and received between the couplers 21, 22 and the couplers 121, 122 to leak into the outside by electromagnetically shielding with the case of the card slot 140. The card slot 140 has a shield structure 142 to shield the couplers electromagnetically. The shield structure 142 can be formed, for example, by putting high-permeability material selectively on the first principal surface 140a and second principal surface 140b of the case of the card slot 140 by plating, vapor deposition, or the like. The high-permeability material may be, for example, a conductor made mainly of iron-nickel alloy (e.g., permalloy) or a conductor made mainly of nickel-cobalt alloy. That is, the couplers 21, 22 are electromagnetically coupled to the couplers of the host 100 respectively when being located in the space shielded by the shield structure 142. Note that the other parts of the case of the card slot 140 can be formed of material of low permeability (such as resin).

Further, in either case of direction, the configuration is made such that the coupler 26 is located outside the space shielded by the shield structure 142 when the couplers 21, 22 are located in the space shielded by the shield structure 142. The coupler 26 is one to be electromagnetically coupled to a coupler 226 of the second host 200. The coupler 26 is configured not to have directivity in order to make it have some degrees of freedom in direction of connection to the coupler 226 of the second host 200. Because connection to an external device via the coupler 26 does not use a connector, the positional relation to the device varies. Accordingly, by making the coupler 26 be of non-directivity or lessening the directivity, connection becomes likely to be stable.

Next, the topology of the memory system 1 (a memory card), the host 100, and the second host 200 will be described using FIG. 14. FIG. 14 is a diagram showing the topology of the memory system (memory card) 1, the host 100, and the second host 200.

Where the memory system (memory card) 1 has the coupler 26, the topology as shown in FIG. 14A can be thought of. The plurality of communication channels are formed between the host 100 and the memory system 1 (a memory card) by the couplers 21, 22 and the couplers 121, 122, and data is transmitted and received via the plurality of communication channels. Thus, the host 100 can access the memory and functions of the memory system (memory card) 1 via the communication channels.

Further, when the memory system (memory card) 1 is inserted into the card slot 140 of the host 100, the coupler 26 is located outside the space shielded by the shield structure 142. Thus, a communication channel can be formed between the memory system 1 (a memory card) and the second host 200 by electromagnetic coupling of the couplers 26 and 226. Thus, the second host 200 can access the memory and functions of the memory system (memory card) 1 via the communication channel. Further, the host 100 and the second host 200 can access each other via the memory system (memory card) 1.

It should be noted that in a case where the memory system (memory card) 1 does not have the coupler 26, as shown in FIG. 14B, the memory system (memory card) 1 and the second host 200 may be connected to the host 100. For example, the coupler (HC1) 121 of the host 100 and the coupler (CC2) 22 of the memory system (memory card) 1 may be electromagnetically coupled, and the coupler (HC2) 122 of the host 100 and the coupler 226 of the second host 200 may be electromagnetically coupled. Or, as shown in FIG. 14C, the host 100 and the second host 200 may be connected to the memory system (memory card) 1. For example, the coupler (HC2) 122 of the host 100 and the coupler (CC1) 21 of the memory system (memory card) 1 may be electromagnetically coupled, and the coupler 226 of the second host 200 and the coupler (CC2) 22 of the memory system (memory card) 1 may be electromagnetically coupled.

As described above, in the fourth embodiment, in the memory system 1, the plurality of power supply terminals 23-1, 23-2 are arranged 180 degrees rotationally symmetrical with respect to the axis AX along the insertion direction of the memory system 1. The plurality of couplers 21, 22 are arranged 180 degrees rotationally symmetrical with respect to the axis AX along the insertion direction of the memory system 1. Thus, the memory system 1 can be configured such that it, oriented in the first direction, is mountable in the host 100 and also, oriented in the second direction opposite to the first direction, is mountable (reverse insertable) in the host 100.

Further, in the fourth embodiment, the host 100 has a shield structure 142 to shield the couplers 21, 22 electromagnetically. The couplers 21, 22 are electromagnetically coupled to the couplers of the host 100 respectively when being located in the space shielded by the shield structure 142. Thus, it can be made difficult for electromagnetic waves transmitted and received between the couplers 21, 22 and the couplers 121, 122 to leak into the outside by shielding electromagnetically with the shield structure 142.

Yet further, in the fourth embodiment, the memory system 1 can have a coupler 26. The configuration is made such that the coupler 26 is located outside the space shielded by the shield structure 142 when the couplers 21, 22 are located in the space shielded by the shield structure 142. The coupler 26 is one to be electromagnetically coupled to the coupler 226 of the second host 200. Thus, the host 100, the memory system 1, and the second host 200 can access each other.

Figure 15:
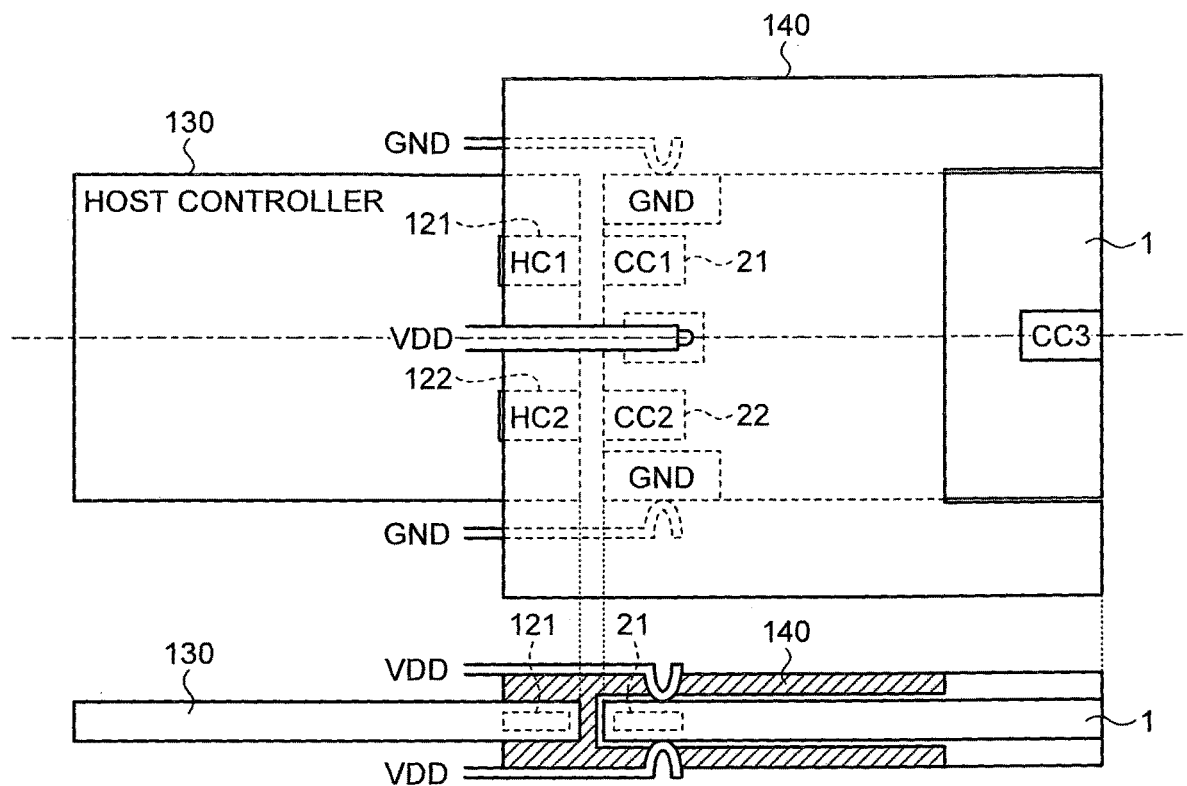
FIG. 15 is a diagram showing the configuration of the card slot of the host in a modified example of the fourth embodiment.

It should be noted that the card slot 140 may be formed integrally with the host controller 130 as shown in FIG. 15. In this case, communication lines between the host controller 130 and the couplers 121, 122 in the host 100 can be omitted, so that data transfer speed in the host 100 can be made higher.

Figure 16:
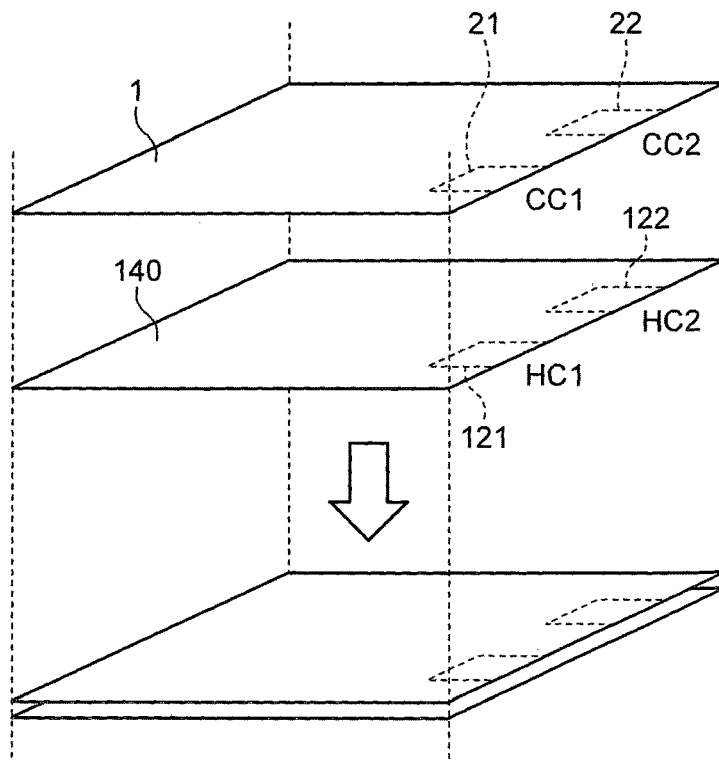
FIG. 16 is a diagram showing the configuration where the memory system (memory card) is mounted in the card slot in another modified example of the fourth embodiment.

When the memory system 1 (a memory card) is mounted (inserted) in the card slot 140 of the host 100, the direction in which the couplers 21, 22 face the couplers of the host 100 may be substantially perpendicular to the first principal surface 140a (see FIG. 12) of the case of the card slot 140 as shown in FIG. 16.

Figure 17:
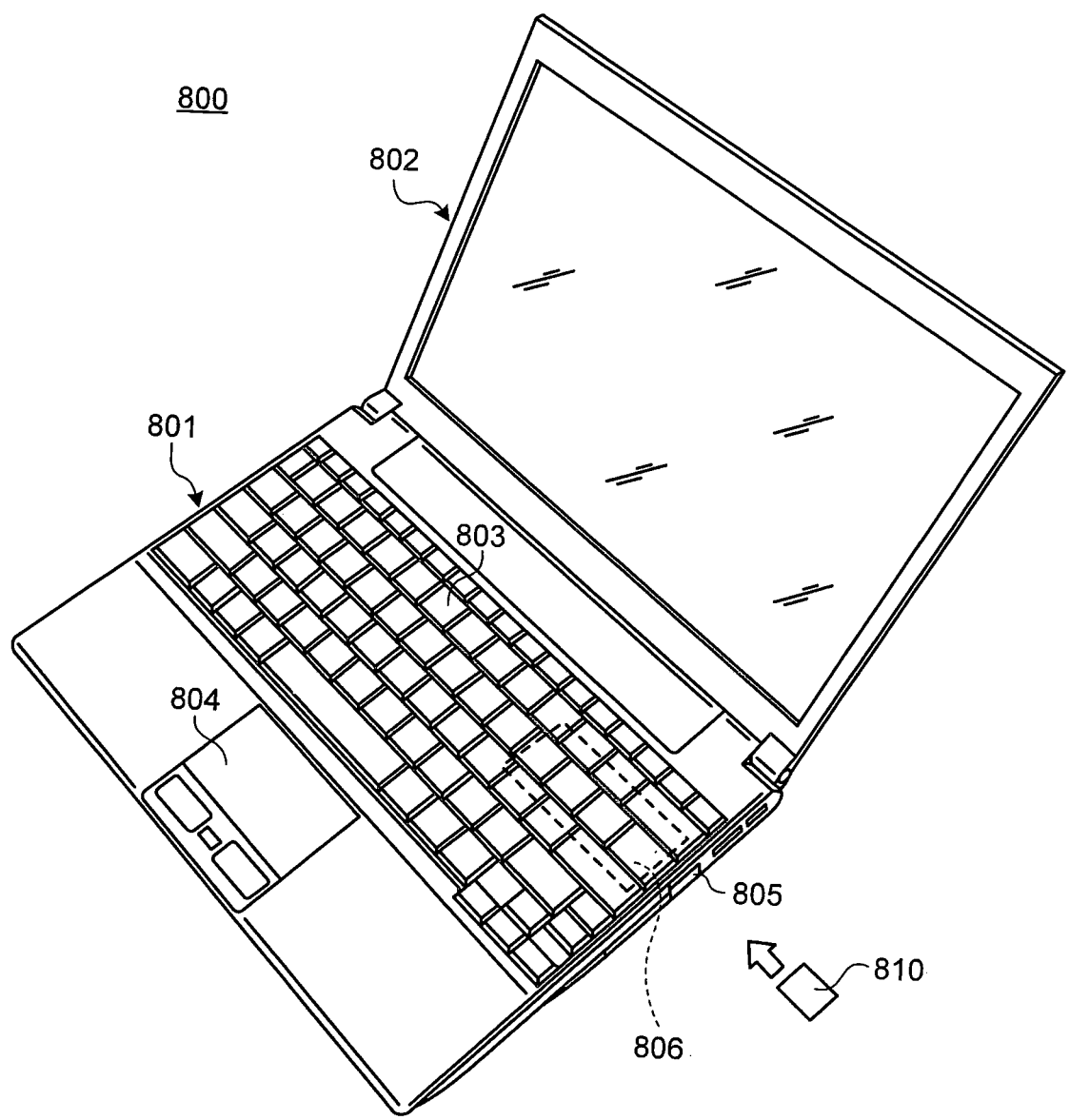
FIG. 17 is a diagram showing an example appearance configuration of a memory system (memory card) and host to which the fourth embodiment can be applied.

Next, as an example of the memory system (memory card) 1 and the host 100 to which the present embodiment can be applied, FIG. 17 illustrates an SD (Secure Digital) card 810 and a personal computer 800, of which the outline will be described. FIG. 17 is a diagram showing an example appearance configuration of a memory system (memory card) and host to which the fourth embodiment can be applied.

The personal computer 800 comprises a body 801 and a display unit 802. The body 801 comprises a key board 803 and a touch pad 804 that is a pointing device. A main circuit board, an SD card slot unit indicated by a broken line and denoted by a reference numeral 806 in the figure, an ODD unit (Optical Disk Device), an SD card slot, and the like are housed in the body 801.

The SD card slot is provided in the outer wall of the body 801. The opening 805 for the SD card slot is provided in this outer wall. A user can insert the SD card 810 into the card slot through the opening 805 from outside the body 801.

A dedicated device driver (host driver) for controlling the aforementioned SD host controller provided in the SD card slot unit 806 is installed in the personal computer 800, and this host driver and the SD host controller perform read/write processing, calibration processing, and the like on the SD card 810 mounted in the SD card slot.

Note that as hosts to which the present embodiment can be applied, not being limited to personal computers as mentioned above, mobile phones, PDAs (Personal Digital Assistants), digital still cameras, digital video cameras, digital television sets, and the like can be cited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory system comprising:
a power supply terminal electrically connectable through a wired connection to a first host, the power supply terminal to be electrically connectable to a power supply line of the first host;
a plurality of couplers configured to perform near-field wireless communication with the first host, each of the plurality of couplers being capable of communicating with each of a plurality of couplers of the first host by using electromagnetic induction; and
a control unit configured to establish, in response to power supply from the first host via the power supply line to the power supply terminal, a reception channel and a transmission channel that are independent of each other between the memory system and the first host via the plurality of couplers,
wherein the control unit, in response to the level of the power supply voltage supplied from the first host being switched from a first level to a second level higher than the first level, receives host basic information about capabilities of the first host from the first host via a first communication channel from among the plurality of communication channels, receives test symbols from the first host via the first communication channel, transmits memory-system basic information about capabilities of the memory system to the first host via a second communication channel from among the plurality of communication channels while receiving the test symbols via the first communication channel, and sets the first communication channel as a reception channel and the second communication channel as a transmission channel.

2. The memory system according to claim 1, wherein each of the plurality of couplers has directivity.

3. The memory system according to claim 1, wherein the plurality of couplers form a plurality of communication channels having different frequency bands from each other.

4. The memory system according to claim 1, wherein the plurality of couplers are placed away from each other at a predetermined short distance or greater.

5. The memory system according to claim 1, wherein in a case where the first host can correctly receive the memory-system basic information while the test symbols is being received via the first communication channel, the control unit sets the first communication channel as a reception channel in overlap-type full-duplex communication and the second communication channel as a transmission channel in the overlap-type full-duplex communication.

6. The memory system according to claim 1, wherein in response to the first host not having correctly received the memory-system basic information while the test symbols were being received via the first communication channel, the control unit receives the host basic information from the first host via the first communication channel, transmits the memory-system basic information to the first host via the second communication channel while the test symbols do not exist on the first communication channel, and sets, in a case where the first host can correctly receive the memory-system basic information while the test symbols do not exist on the first communication channel, the first communication channel as a reception channel in non-overlap-type hill-duplex communication and the second communication channel as a transmission channel in the non-overlap-type full-duplex communication.

7. The memory system according to claim 6, wherein in a case where the first host cannot correctly receive the memory-system basic information while the test symbols do not exist on the first communication channel, the control unit sets one of the first communication channel and the second communication channel as a transmission/reception dual-purpose channel in half-duplex communication.

8. The memory system according to claim 1, wherein in a case where the memory system receives a request to switch to an extended mode adopted by the first host from among capabilities included in the memory-system basic information from the first host via the first communication channel, if the memory system can accept switching to the extended mode, the control unit transmits response information indicating acceptance to the first host via the second communication channel.

9. The memory system according to claim 8, wherein in response to the level of the power supply voltage supplied from the first host being switched from the second level to a third level between the first level and the second level back to the second level again, the control unit has communication operation of the memory system go into an extended mode agreeing with capability list and establishes the first communication channel as a reception channel agreeing with the extended mode and the second communication channel as a transmission channel agreeing with the extended mode.

10. The memory system according to claim 9, wherein after establishing the reception channel and the transmission channel, in response to the level of the power supply voltage supplied from the first host via the power supply terminal being switched from the second level to the third level, the control unit has communication operation of the memory system go from the extended mode into a power saving mode.

11. The memory system according to claim 10, wherein in response to the level of the power supply voltage supplied from the first host via the power supply terminal returning from the third level to the second level, the control unit has communication operation of the memory system return from the power saving mode to the extended mode.

12. The memory system according to claim 10, wherein while the level of the power supply voltage supplied from the first host via the power supply terminal is the third level, the control unit transmits a trigger signal to request to switch the level of the power supply voltage back to the second level to the first host via the second communication channel, and, in response to the level of the power supply voltage supplied from the first host via the power supply terminal returning from the third level to the second level in response to the trigger signal, stops transmitting the trigger signal and has communication operation of the memory system return from the power saving mode to the extended mode.

13. The memory system according to claim 1, wherein the first host has a shield structure to shield the plurality of couplers electromagnetically, and the plurality of couplers are electromagnetically coupled to the couplers of the first host respectively in a case of being located in a space shielded by the shield structure.

14. The memory system according to claim 13, further comprising: a second coupler to be electromagnetically coupled to a coupler of a second host and configured so as to be located outside the space shielded by the shield structure in a case where the plurality of couplers are located in the space shielded by the shield structure.

15. The memory system according to claim 14, wherein each of the plurality of couplers has directivity, and
the second coupler is lessened in directivity than the plurality of couplers.

16. A memory system comprising:
a power supply terminal electrically connectable through a wired connection to a first host, the power supply terminal to be electrically connectable to a power supply line of the first host;
a plurality of couplers configured to perform near-field wireless communication with the first host, each of the plurality of couplers being capable of communicating with each of a plurality of couplers of the first host by using electromagnetic induction; and
a control unit configured to establish, in response to power supply from the first host via the power supply line to the power supply terminal, a reception channel and a transmission channel that are independent of each other between the memory system and the first host via the plurality of couplers,
wherein the control unit includes:
 a voltage recognizer that recognizes the level of the power supply voltage supplied from the first host via the power supply terminal using a first reference level and a second reference level higher than the first reference level;
 a first regulator that, in a case where the level of the power supply voltage supplied is greater than or equal to the first reference level, generates a first internal voltage and, in a case where the level of the power supply voltage supplied is less than the first reference level, stops operating;
 a second regulator that, in a case where the level of the power supply voltage supplied is greater than or equal to the second reference level, generates a second internal voltage higher than the first internal voltage and, in a case where the level of the power supply voltage supplied is less than the second reference level, stops operating;
 a first internal circuit that, in a case where the level of the power supply voltage supplied is greater than or equal to the first reference level, operates with use of the first internal voltage; and
 a second internal circuit that, in a case where the level of the power supply voltage supplied is greater than or equal to the second reference level, operates with use of the second internal voltage and, in a case where the level of the power supply voltage supplied is less than the second reference level, suspends operation.

17. The memory system according to claim 16, wherein the first internal circuit includes a circuit that performs control to establish a communication channel, or registers or a memory to hold states while power is being saved.

18. A memory system comprising:
a power supply terminal electrically connectable through a wired connection to a first host, the power supply terminal to be electrically connectable to a power supply line of the first host;
a plurality of couplers configured to perform near-field wireless communication with the first host, each of the plurality of couplers being capable of communicating with each of a plurality of couplers of the first host by using electromagnetic induction; and
a control unit configured to establish, in response to power supply from the first host via the power supply line to the power supply terminal, a reception channel and a transmission channel that are independent of each other between the memory system and the first host via the plurality of couplers,
wherein the memory system is a memory card to be inserted into the first host and comprises a plurality of the power supply terminals, and
the plurality of power supply terminals are arranged rotationally symmetrical with respect to an insertion direction of the memory system, and
wherein the plurality of couplers are arranged rotationally symmetrical with respect to the insertion direction of the memory system, and
the memory system has a mechanism that determines pairs of a coupler of the memory system and a coupler of the host.

19. The memory system according to claim 18, wherein the memory system further comprises a plurality of ground terminals to be respectively connected to ground lines of the first host, and the plurality of ground terminals are arranged rotationally symmetrical with respect to the insertion direction of the memory system.

* * * * *